(12) United States Patent
Nakajima

(10) Patent No.: US 7,037,779 B2
(45) Date of Patent: May 2, 2006

(54) SEMICONDUCTOR DEVICE AND MANUFACTURING METHOD THEREOF

(75) Inventor: Setsuo Nakajima, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/376,010

(22) Filed: Feb. 28, 2003

(65) Prior Publication Data

US 2003/0148561 A1    Aug. 7, 2003

Related U.S. Application Data

(62) Division of application No. 09/803,207, filed on Mar. 8, 2001, now abandoned.

(30) Foreign Application Priority Data

Mar. 10, 2000  (JP) ............... 2000-066588

(51) Int. Cl.
   *H01L 21/00* (2006.01)
   *H01L 21/84* (2006.01)
   *H01L 21/336* (2006.01)
   *H01L 21/36* (2006.01)
   *H01L 21/20* (2006.01)

(52) U.S. Cl. .............. 438/257; 438/149; 438/151; 438/486

(58) Field of Classification Search ........ 438/257, 438/149, 151, 150, 153, 154, 162, 166, 471, 438/473, 486
   See application file for complete search history.

(56) References Cited

U.S. PATENT DOCUMENTS

| 4,410,375 | A | * | 10/1983 | Sawada et al. ............ 438/402 |
| 5,272,099 | A | | 12/1993 | Chou et al. |
| 5,643,826 | A | | 7/1997 | Ohtani et al. |
| 5,700,333 | A | | 12/1997 | Yamazaki et al. |
| 5,843,225 | A | | 12/1998 | Takayama et al. |
| 5,915,174 | A | | 6/1999 | Yamazaki et al. |
| 5,923,962 | A | | 7/1999 | Ohtani et al. |
| 5,953,597 | A | * | 9/1999 | Kusumoto et al. ......... 438/161 |
| 5,961,743 | A | | 10/1999 | Yamazaki et al. |
| 5,977,559 | A | | 11/1999 | Zhang et al. |
| 6,031,249 | A | * | 2/2000 | Yamazaki et al. ............ 257/66 |
| 6,066,518 | A | | 5/2000 | Yamazaki |
| 6,072,193 | A | | 6/2000 | Ohnuma et al. |
| 6,133,075 | A | | 10/2000 | Yamazaki et al. |

(Continued)

FOREIGN PATENT DOCUMENTS

JP    07-130652    5/1995

(Continued)

*Primary Examiner*—Chuong Anh Luu
(74) *Attorney, Agent, or Firm*—Fish & Richardson P.C.

(57) ABSTRACT

In a thin film transistor, a metallic element promoting crystallization of an amorphous silicon film is effectively removed and the productivity is improved. By using a silicon film containing an element belonging to the group 15 such as phosphorus through contact holes reaching a source region and a drain region, a metallic element promoting crystallization of an amorphous silicon film can be effectively removed or decreased and the productivity can be improved.

35 Claims, 20 Drawing Sheets

U.S. PATENT DOCUMENTS

| | | | |
|---|---|---|---|
| 6,133,119 | A | 10/2000 | Yamazaki |
| 6,156,590 | A | 12/2000 | Yamazaki et al. |
| 6,156,628 | A * | 12/2000 | Ohnuma et al. ............ 438/486 |
| 6,194,255 | B1 | 2/2001 | Hiroki et al. |
| 6,251,712 | B1 | 6/2001 | Tanaka et al. |
| 6,303,415 | B1 | 10/2001 | Yamazaki |
| 6,310,363 | B1 | 10/2001 | Ohnuma et al. |
| 6,316,789 | B1 | 11/2001 | Yamazaki et al. |
| 6,433,363 | B1 | 8/2002 | Yamazaki et al. |
| 6,518,102 | B1 | 2/2003 | Tanaka et al. |
| 6,541,793 | B1 | 4/2003 | Ohnuma et al. |
| 6,576,924 | B1 | 6/2003 | Yamazaki et al. |
| 6,639,244 | B1 | 10/2003 | Yamazaki et al. |
| 6,727,124 | B1 | 4/2004 | Nakajima et al. |
| 6,743,667 | B1 | 6/2004 | Hiroki et al. |

FOREIGN PATENT DOCUMENTS

| | | |
|---|---|---|
| JP | 11-354448 | 12/1999 |

* cited by examiner

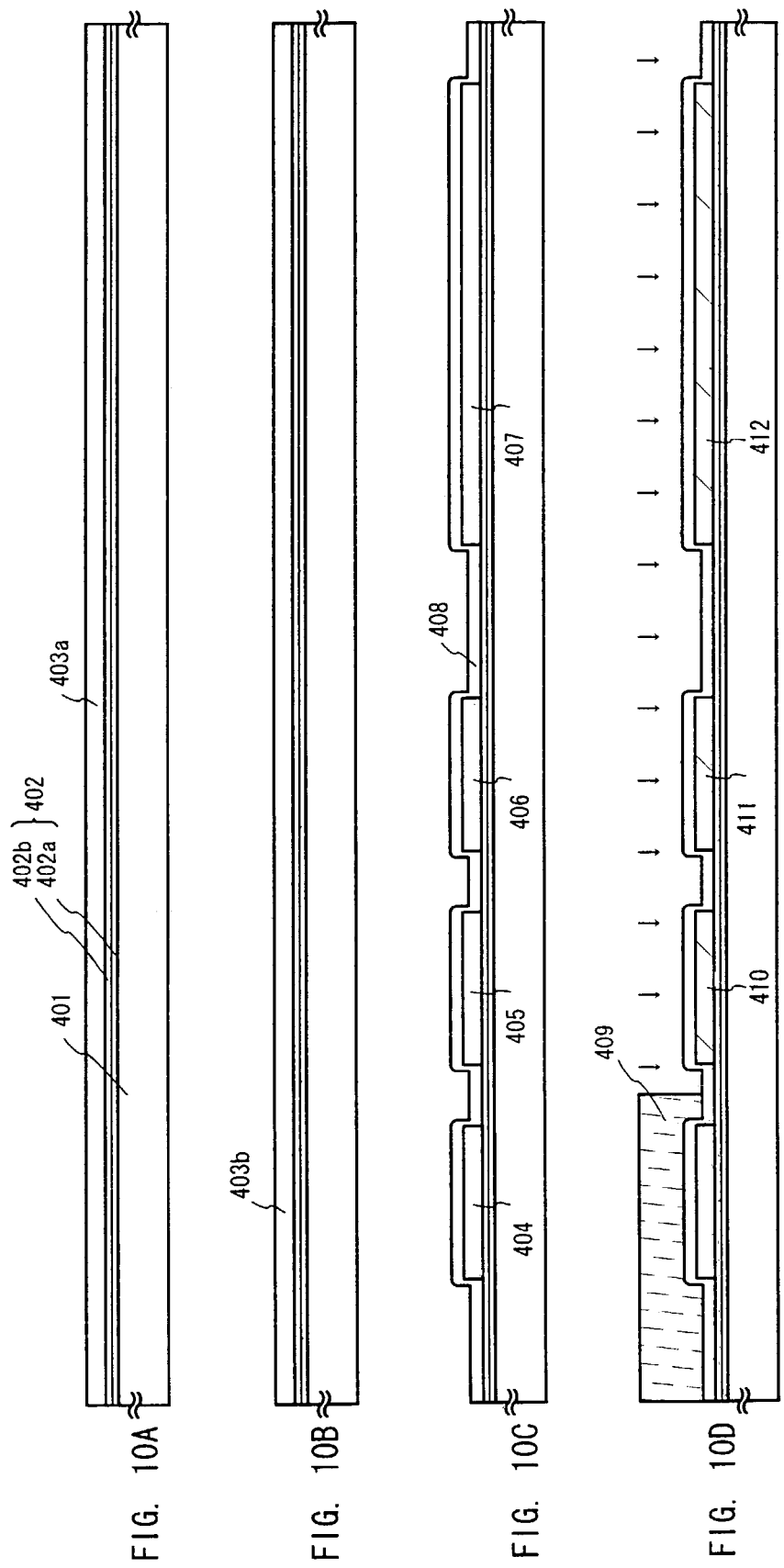

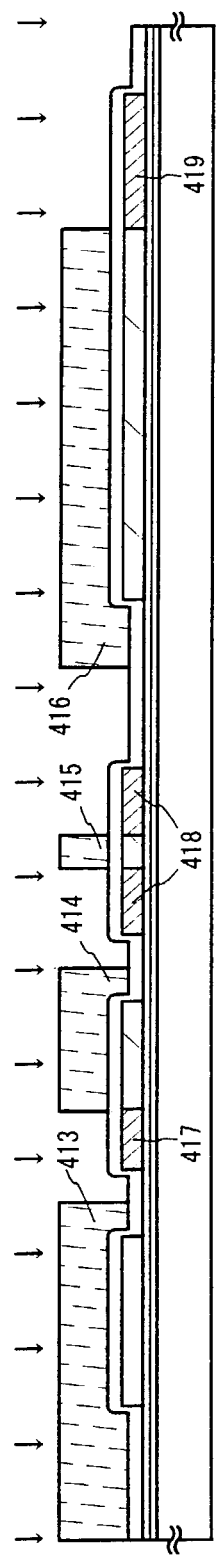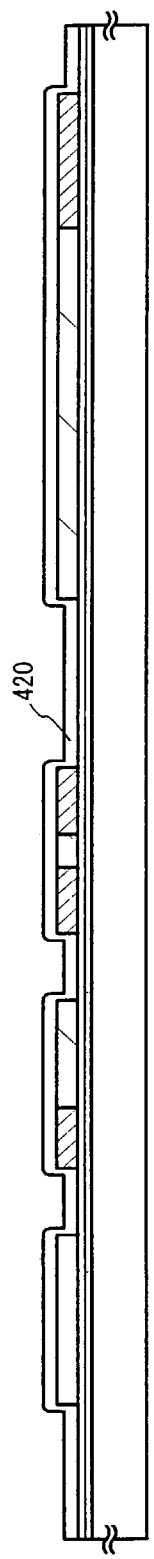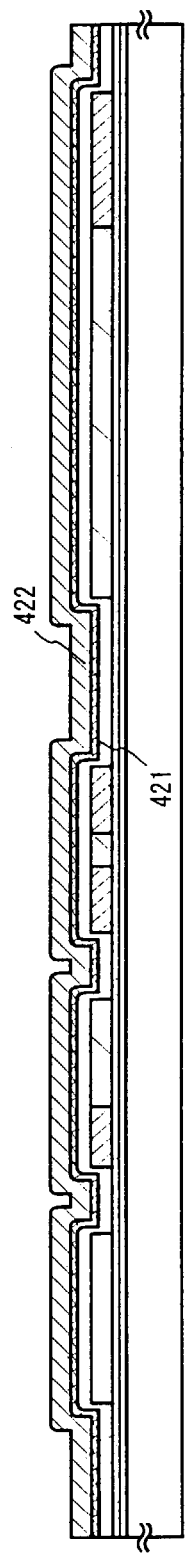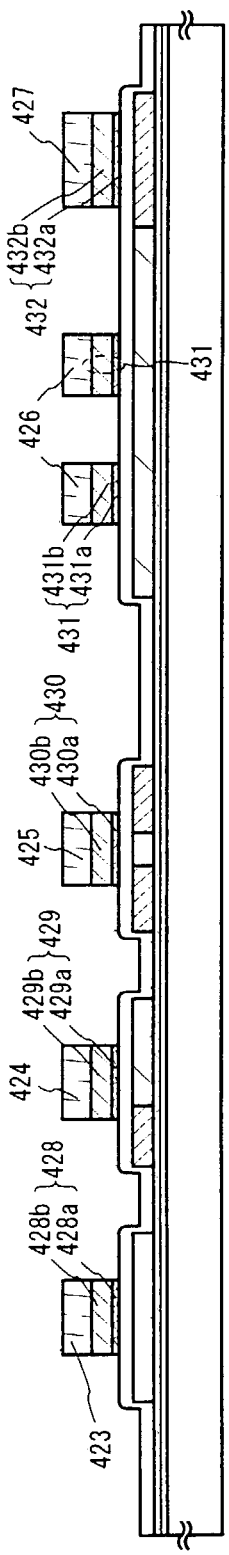

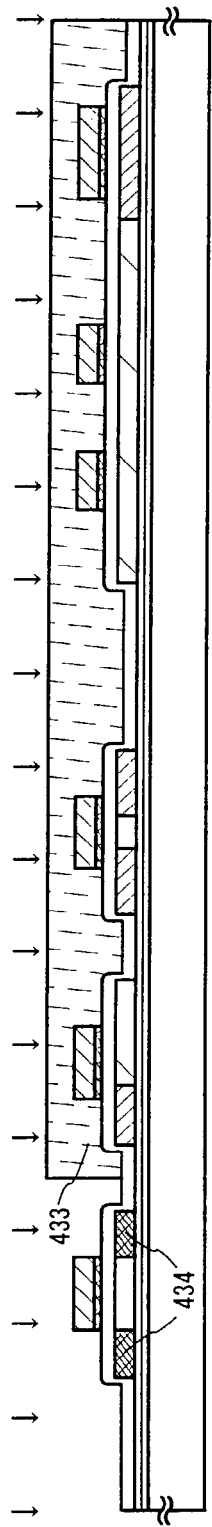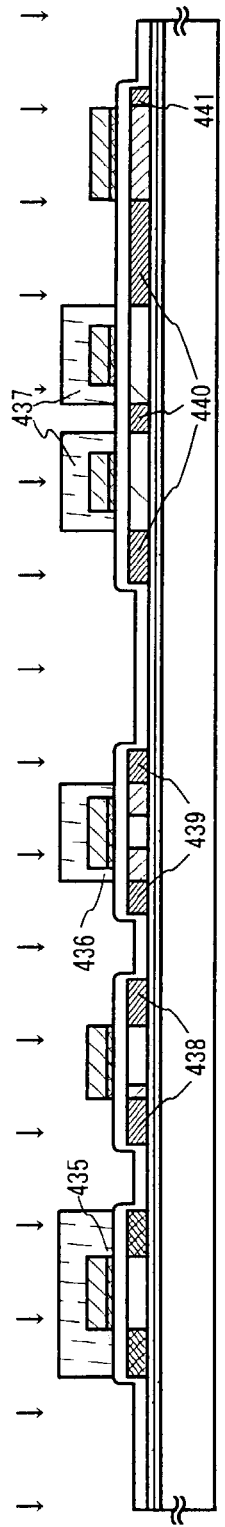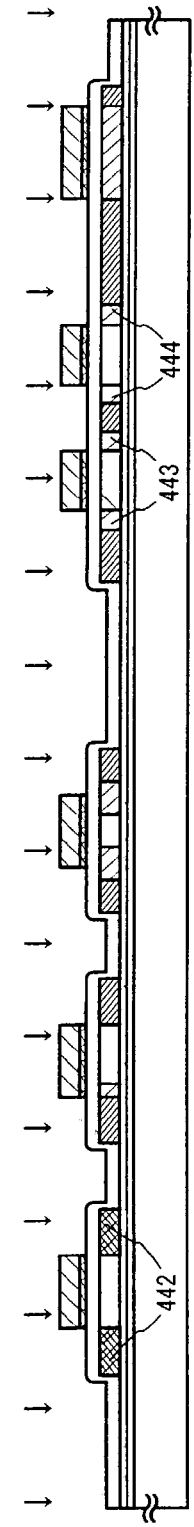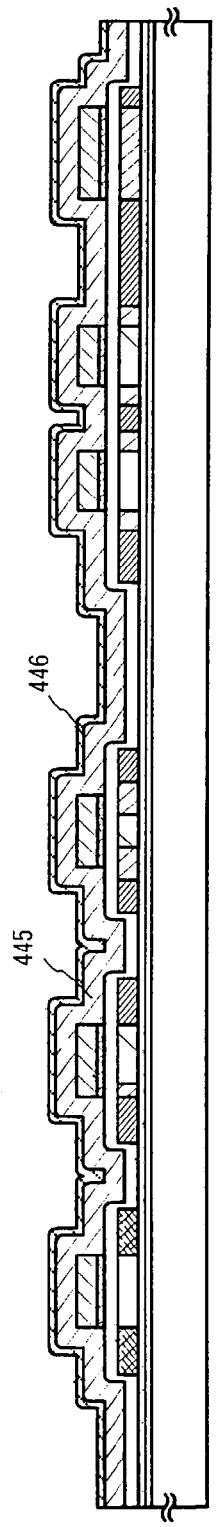

SEMICONDUCTOR DEVICE AND MANUFACTURING METHOD THEREOF

CROSS-REFERENCE TO RELATED APPLICATIONS

This application is a divisional of U.S. application Ser. No. 09/803,207, filed Mar. 8, 2001 now abandoned.

BACKGROUND OF THE INVENTION

1. Field of the Invention

The present invention relates to a method of manufacturing a semiconductor device having a circuit formed of thin film transistors (hereinafter referred to as TFTs) using a method of effectively removing a metallic element which promotes crystallization of an amorphous silicon film. For example, the present invention relates to an electro-optical device represented by an active matrix liquid crystal display device having a pixel portion and a driver circuit provided on one substrate, and to an electronic apparatus having such an electro-optical device mounted thereon as a component.

Also, the present invention relates to a light emitting device using a light emitting element which utilizes a light emitting material in which EL (electro luminescence) is obtained as the light emitting material (hereafter referred to as an EL light emitting device, an EL element, and an EL material, respectively). Note that EL materials which can be used in the present invention include all light emitting materials in which light is emitted via singlet state excitation, triplet state excitation, or both types of excitation (phosphorescence and/or fluorescence).

It is to be noted that, as used herein, the term "semiconductor device" means any device which can function by utilizing semiconductor characteristics, and includes not only any single element as a TFT but also any electro-optical device formed using TFTs, any electronic apparatus having such an electro-optical device mounted thereon as a component, and any semiconductor circuit.

2. Description of the Related Art

A TFT using a semiconductor thin film is utilized in various kinds of integrated circuits. Semiconductor thin films include amorphous silicon films and crystalline silicon films. An amorphous silicon film is easily formed, and thus, has excellent productivity. However, since the electric characteristics of its TFT is low, the operation speed is slow, and therefore, it can not be used in an active matrix liquid crystal display device having an integral, peripheral driver circuit, and can not form various kinds of integral circuits. Therefore, in such a case, a crystalline silicon film having better characteristics is used.

As methods of forming a crystalline silicon film, there are thermal annealing and laser annealing. Thermal annealing requires a high-temperature process of 600° C. or above, and thus, it can not be applied to a glass substrate which is low-cost and permits large-area device. Thermal annealing has another problem that the process time is long. On the other hand, with regard to laser annealing, though it can realize a process which does not cause thermal damage to a substrate, it has problems such as insufficient evenness of crystallization, insufficient repeatability, and insufficient crystallinity. One way to solve these problems is to promote crystallization using a predetermined metallic element.

For example, Japanese Patent Application Laid-open No. Hei 7-130652 applied by the assignee of the present invention discloses a method which uses thermal annealing but suppresses the crystallization temperature to 600° C. or lower which is applicable to a glass substrate. In this method, thermal annealing is performed with a metallic element represented by Ni introduced in an amorphous silicon film, and a crystalline silicon film having sufficient crystallinity can be obtained.

In a case a method is used where a predetermined metallic element is used to promote crystallization, since crystallization proceeds as the metallic element diffuses and moves, the metallic element for promoting crystallization remains in the crystalline silicon film. As a result, the metallic element deposits around the vicinity of the surface of the crystalline silicon film to cause leak at a junction. Further, the metallic element forms a deep level to become a center of recombination or generation of carriers. Therefore, there is a problem that the stability and the reliability of the electric characteristics of the TFT are deteriorated. In order to solve the problem, various kinds of gettering technologies have been developed to remove or decrease the metallic element.

Gettering is performed by, for example, after the amorphous silicon film is crystallized into a crystalline silicon film using the metallic element and a portion to be a device region is covered with a mask layer such as an oxide film, heavily doping an element of the group 15 such as P, which is effective in gettering, in the remaining region other than the device region to make that region other than the device region is promote gettering (hereinafter referred to as a gettering site), or, after a portion to be a device region is masked in a similar way, forming thereon a silicon film containing a high concentration of an element of the group 15 such as P to be a gettering site. However, since these methods require processes of forming and patterning a film to be a mask layer, the number of the masks increases, the manufacturing cost increases, and the productivity is lowered.

Another way to perform gettering is, for example, to make a source region and a drain region of a device a gettering site. In this method, though the number of the masks can be decreased since patterning for the gettering is not necessary, the capacity of the gettering site is limited and the gettering efficiency is lowered to some extent. Further, since the element of the group 15 such as P to be a donor is doped also in a p-channel TFT, an excess amount of ions to be an acceptor has to be doped, which causes increase in the manufacturing cost and lowering of the productivity.

SUMMARY OF THE INVENTION

Accordingly, an object of the present invention is, with regard to a TFT formed using a crystalline semiconductor film which is obtained by utilizing a metallic element for promoting crystallization of an amorphous semiconductor film, to provide a technology to suppress the adverse affect of the metallic element on the characteristics of the TFT and to attain lowering of the manufacturing cost and improvement in the productivity.

According to an aspect of the present invention, a semiconductor device comprising a base insulating film formed on a substrate, a crystalline semiconductor film formed on the underlayer insulating film, the crystalline semiconductor film having a source region, a drain region, and a channel forming region sandwiched between the source region and the drain region, a gate insulating film formed on the crystalline semiconductor film, a gate electrode formed on the gate insulating film, an interlayer insulating film formed on the gate electrode, a film containing phosphorus formed on the interlayer insulating film, and a conductive layer formed on the film containing an impurity element belonging to the group 15 of the periodic table, is characterized in that the film containing the impurity element belonging to the group 15 of the periodic table is in contact with the source region or the drain region of the crystalline semiconductor film in a contact hole formed in the interlayer insulating film, and that a metallic element required in forming the crystalline semiconductor film segregates in the film containing the impurity element belonging to the group 15 of the periodic table.

According to another aspect of the present invention, a semiconductor device comprising a gate electrode formed on an insulating surface, a gate insulating film formed on the gate electrode, a crystalline semiconductor film formed on the gate insulating film, the crystalline semiconductor film having a source region, a drain region, and a channel forming region sandwiched between the source region and the drain region, a protective insulating film formed on the crystalline semiconductor film, an interlayer insulating film formed on the protective insulating film, a film containing an impurity element belonging to the group 15 of the periodic table formed on the interlayer insulating film, and a conductive layer formed on the film containing an impurity element belonging to the group 15 of the periodic table, is characterized in that the film containing the impurity element belonging to the group 15 of the periodic table is in contact with the source region or the drain region of the crystalline semiconductor film in a contact hole formed in the interlayer insulating film, and that a metallic element required in forming the crystalline semiconductor film segregates is in the film containing the impurity element belonging to the group 15 of the periodic table.

According to another aspect of the present invention, a method of manufacturing a semiconductor device having a thin film transistor formed on a substrate comprises the steps of forming a base insulating film on the substrate, forming an amorphous semiconductor film on the underlayer insulating film, doping a metallic element promoting crystallization of the amorphous semiconductor film and crystallizing the amorphous semiconductor film to form a crystalline semiconductor film, forming a gate insulating film on the crystalline semiconductor film, forming a gate electrode on the gate insulating film, doping an impurity element in a selected region of the crystalline semiconductor film to form a source region and a drain region, forming an interlayer insulating film on the gate electrode, forming a contact hole in the interlayer insulating film, the contact hole reaching the source region or the drain region, forming a film containing an impurity element belonging to the group 15 of the periodic table in the contact hole reaching the source region or the drain region and on the interlayer insulating film, gettering by thermal annealing the metallic element contained in the crystalline semiconductor film, and forming a conductive film on the film containing an impurity element belonging to the group 15 of the periodic table.

According to another aspect of the present invention, a method of manufacturing a semiconductor device having a thin film transistor formed on an insulating surface comprises the steps of forming a gate electrode on the insulating surface, forming a gate insulating film on the gate electrode, forming an amorphous semiconductor film on the gate insulating film, doping a metallic element promoting crystallization of the amorphous semiconductor film and crystallizing the amorphous semiconductor film to form a crystalline semiconductor film, forming a protective insulating film on the crystalline semiconductor film, doping an impurity element in a selected region of the crystalline semiconductor film to form a source region and a drain region, forming an interlayer insulating film on the protective insulating film, forming a contact hole in the protective insulating film and the interlayer insulating film, the contact hole reaching the source region or the drain region, forming a film containing an impurity element belonging to the group 15 of the periodic table in the contact hole reaching the source region or the drain region and on the interlayer insulating film, gettering by thermal annealing the metallic element contained in the crystalline semiconductor film, and forming a conductive film on the film containing an impurity element belonging to the group 15 of the periodic table.

In the above four aspects of the present invention, the film containing the impurity element belonging to the group 15 of the periodic table functions as a gettering site of the metallic element promoting crystallization of the amorphous semiconductor film by thermal annealing through the contact hole reaching the source region or the drain region.

In the above four aspects of the present invention, the inventors of the present invention have found that Ni is preferable as the metallic element promoting crystallization of the amorphous semiconductor film. Generally, as the metallic element promoting crystallization of the amorphous semiconductor film, one or more elements selected from the group consisting of Fe, Co, Ni, Ru, Rh, Pd, Os, Ir, Pt, Cu, Au, Ge, Pb, and In can be used.

In the above four aspects of the present invention, the impurity element belonging to the group 15 of the periodic table is an element for gettering the metallic element promoting crystallization of the amorphous semiconductor film. Such gettering can be performed effectively when nickel (Ni) is selected as the metallic element promoting crystallization of the amorphous semiconductor film and phosphorus (P) is selected as the gettering element.

When phosphorus is selected as the impurity element belonging to the group 15 of the periodic table, the concentration of phosphorus in the film containing phosphorus is $1\times10^{19}$ atoms/cm$^3$ or more. In a p-channel TFT, an impurity region of a semiconductor film and the film containing phosphorus form a PN junction. Since the concentration of the impurity element is high in the impurity region and in the film, and since there are many crystal defects in a polycrystalline semiconductor film, a tunnel junction is formed in the contact hole portion where the impurity region of the semiconductor layer is in contact with the silicon film containing phosphorus, and sufficiently low contact resistance can be obtained.

The metallic element for promoting crystallization can be introduced by ion injection, diffusion using a solution, diffusion using a solid, diffusion from a film formed by sputtering or CVD, plasma processing, gas adsorption, or the like. The silicon film containing phosphorus as the gettering element can be formed using a plasma enhanced CVD (P-CVD) system, a low pressure CVD (LP-CVD) system, a sputtering system, or the like.

In the above four aspects of the present invention, thermal annealing not only progresses gettering of the metallic element promoting crystallization of the amorphous semiconductor film but also activates the impurity element doped for forming the source and drain regions. Therefore, by performing thermal annealing, heat treatment necessary to progress gettering and to activate the impurity element can be performed at the same time.

Further, in the above four aspects of the present invention, after the conductive film is formed on the film containing phosphorus, the film containing phosphorus is patterned using the conductive film in a self-aligning manner to function as wiring. The conductive film comprise at least a metallic element such as Al, Ti, W, Ta, Cu, and so on.

BRIEF DESCRIPTION OF THE DRAWINGS

In the accompanying drawings:

FIG. 10 illustrates a process of forming a pixel TFT and a driver circuit TFT on one substrate;

FIG. 11 illustrates the process of forming a pixel TFT and a driver circuit TFT on one substrate;

FIG. 12 illustrates the process of forming a pixel TFT and a driver circuit TFT on one substrate;

DETAILED DESCRIPTION OF THE PREFERRED EMBODIMENTS

Figure 1:
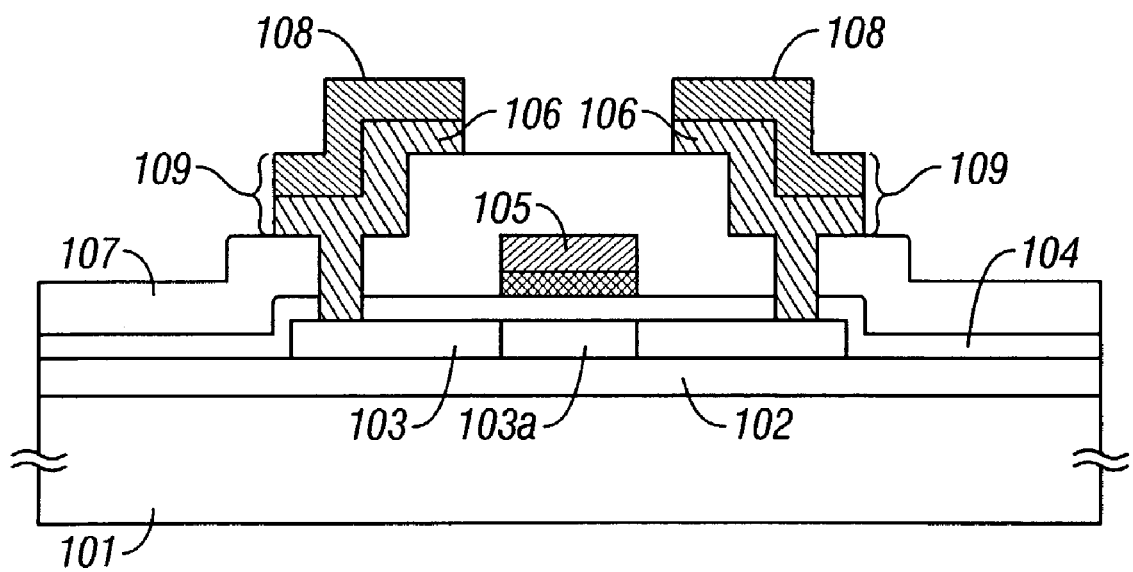
FIG. 1 illustrates an example of a structure according to the present invention.

FIG. 1 illustrates a specific example of a structure according to the present invention.

That is, a base insulating film 102 is formed on a substrate 101. A crystalline silicon film 103 is formed on the underlayer insulating film 102. A gate insulating film 104 is formed on the crystalline silicon film 103 having a channel forming region 103a and a source or drain region and on the underlayer insulating film 102. A gate electrode 105 is formed on the gate insulating film 104. An interlayer insulating film 107 is formed on the gate electrode 105 and the gate insulating film 104. A contact hole reaching the source or drain region of the crystalline silicon film 103 is formed in the interlayer insulating film 107 and the gate insulating film 104. A silicon film 106 containing an impurity element belonging to the group 15 of the periodic table is formed in the contact hole reaching the source or drain region and on the interlayer insulating film 107. A conductive film 108 is formed on the silicon film 106 containing the impurity element belonging to the group 15 of the periodic table. Finally, a source or drain electrode 109 having as its lower layer the silicon film 106 containing the impurity element belonging to the group 15 of the periodic table is formed.

The crystalline silicon film 103 is formed by forming an amorphous silicon film on the underlayer insulating film 102, introducing in the amorphous silicon film a metallic element promoting crystallization, and performing thermal annealing. Therefore, the crystalline silicon film contains the metallic element promoting crystallization. The impurity element belonging to the group 15 of the periodic table contained in the silicon film 106 has an action to getter the metallic element promoting crystallization by thermal annealing.

When thermal annealing is performed after the silicon film 106 containing the impurity element belonging to the group 15 of the periodic table is formed, through the contact hole reaching the source or drain region of the crystalline silicon film (hereinafter referred to as a source contact or a drain contact), the metallic element promoting crystallization is effectively removed from the crystalline silicon film by phosphorus having the gettering action in the silicon film 106. Further, by performing thermal annealing after the silicon film 106 containing the impurity element belonging to the group 15 of the periodic table is formed, since the silicon film 106 exists on the whole surface of the substrate, the whole substrate becomes the gettering site, and thus, gettering is performed more efficiently compared with a case where the source or drain region is the gettering site. After that, the silicon film 106 containing the impurity element belonging to the group 15 of the periodic table, together with the conductive film 108, function as the source or drain electrode 109.

The present structure is characterized in that the silicon film containing the impurity element belonging to the group 15 of the periodic table is formed in contact with the source contact and the drain contact and is made to be the gettering site, and thus processes of forming and patterning a conventionally used mask layer such as an oxide film can be eliminated. This can lower the manufacturing cost and improve the productivity.

It is to be noted that the present structure is just an example, and the present invention is not limited thereto. The present invention intends that a film containing an impurity element belonging to the group 15 of the periodic table is made to be a gettering site through a source contact and a drain contact to getter a metallic element promoting crystallization of an amorphous semiconductor film.

[Embodiment 1]

In the present embodiment, a method of forming on one substrate an n-channel TFT and a p-channel TFT necessary for forming a CMOS circuit is described along its processes with reference to FIGS. 2 to 5. The method applies the crystallizing method using a metallic element disclosed in Japanese Patent Application Laid-open No. Hei 7-130652 as a method of forming a crystalline silicon film to be an active layer of the TFTs.

Figure 2A:
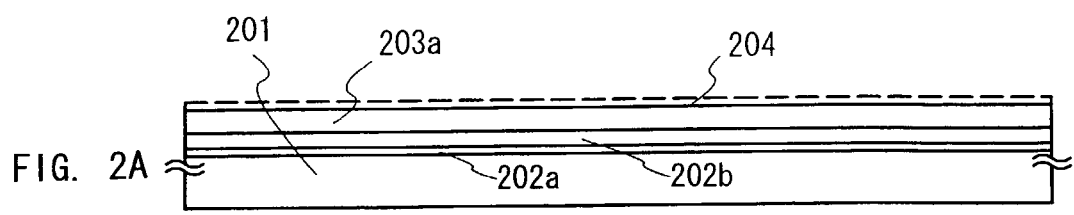
FIG. 2 illustrates a process of forming an n-channel TFT and a p-channel TFT on one substrate.

As illustrated in FIG. 2A, underlayer insulating films 202a and 202b are formed on a substrate 201 to form an underlayer insulating layer. As the substrate 201, a glass substrate of barium borosilicate glass or aluminoborosilicate glass is used. Since such a glass substrate shrinks by several ppm to several tens of ppm depending on the temperature during heat treatment, the glass substrate may be heat treated in advance at a temperature which is lower than the heat distortion point of the glass by 10 to 20° C. Further, such a glass substrate contains a very small amount of alkali metal element such as sodium, which may enter an active layer to influence the electric characteristics of the TFT. As a blocking layer against such an element, the underlayer insulating films 202a and 202b are provided. As the underlayer insulating films, a silicon nitride film and a silicon oxide film may be used. The former film has an advantage that the blocking effect against the impurity element is high but has a disadvantage that there are many trap levels. The latter film has an advantage that the band gap is wide, the insulation is excellent, and the trap level is deep, and has a disadvantage that the blocking effect against the impurity element is low. Therefore, by providing a silicon nitride film on the side of the substrate and providing a silicon oxide film on the side of an active layer, an underlayer insulating layer which makes use of the advantages of the two films can be formed. Here, for example, a silicon oxynitride film containing a high percentage of nitrogen is used as the underlayer insulating film 202a and a silicon oxynitride film containing a high percentage of oxygen is used as the underlayer insulating film 202b. The underlayer insulating film 202a is formed from $SiH_4$, $NH_3$, and $N_2O$ at the thickness of 10 to 100 nm (preferably 20 to 60 nm), while the underlayer insulating film 202b is formed from $SiH_4$ and $N_2O$ at the thickness of 10 to 200 nm (preferably 20 to 100 nm).

These films are formed by conventional parallel plate plasma enhanced CVD. 10 SCCM of $SiH_4$, 100 SCCM of $NH_3$, and 20 SCCM of $N_2O$ are introduced into a reaction chamber, and the silicon oxynitride film 202a is formed with the substrate temperature being 400° C., the reaction pressure being 0.3 Torr, the discharge electric power density being 0.41 $W/cm^2$, and the discharge frequency being 60 MHz. After the silicon oxynitride film 202a is formed, the chamber may be cleaned for the purpose of supplying the film with stability taking measures to deal with contaminant. During that time, the substrate having the silicon oxynitride film 202a formed thereon is out of the chamber, and therefore, is influenced by the environment in a clean room, and may have phosphorus or carbon as a contaminant element attached on the surface thereof. Therefore, $N_2O$ plasma processing may be performed to effectively remove phosphorus or carbon attached on the surface of the silicon oxynitride film 202a. This can decrease variation in the electric characteristics of the TFT accompanying movement of such a contaminant element into the active layer. On the other hand, with regard to the silicon oxynitride film 202b, 4 SCCM of $SiH_4$ and 400 SCCM of $N_2O$ are introduced into a reaction chamber, and the silicon oxynitride film 202b is formed with the substrate temperature being 400° C., the reaction pressure being 0.3 Torr, the discharge electric power density being 0.41 $W/cm^2$, and the discharge frequency being 60 MHz.

The density of the silicon oxynitride film 202a formed here is $9.28 \times 10^{22}/cm^3$. When the silicon oxynitride film 202a is etched using a mixed solution containing 7.13% of ammonium bifluoride ($NH_4HF_2$) and 15.4% of ammonium fluoride ($NH_4F$) (made by Stella Chemifa Corporation under the name of LAL500), the etching rate at 20° C. is as slow as 63 nm/min. The silicon oxynitride film 202a is a dense and hard film. By using such a film as the underlayer insulating film, an alkali metal element can be prevented from diffusing into the active layer.

Then, an amorphous silicon film 203a is formed at the thickness of 25 to 80 nm (preferably 30 to 60 nm) by a conventional method such as plasma enhanced CVD or sputtering to form an amorphous semiconductor layer. Here, for example, an amorphous silicon film is formed at the thickness of 55 nm. Further, the underlayer film 202b and the amorphous silicon film 203a may be both continuously formed. For example, after the silicon oxynitride film 202a and the silicon oxynitride film 202b are formed by plasma enhanced CVD, by changing the reaction gas from $SiH_4$ and $N_2O$ to $SiH_4$ and $H_2$ or only $SiH_4$, continuous film formation can be performed without exposing the device to the atmosphere for a time. As a result, contamination of the surface of the silicon oxynitride film 202b can be prevented, and variation in the characteristics of the TFTs formed and variation in Vth can be decreased.

In order to perform crystallization using a metallic element, an aqueous solution containing 10 ppm of the metallic element (conversion into weight) is applied by spin coating to form a layer 204 containing the metallic element. As the metallic element, Fe, Co, Ni, Ru, Rh, Pd, Os, Ir, Pt, Cu, Au, Ge, Pb, In, or the like is used. The layer 204 containing the metallic element may be formed by forming a layer of the above metallic element at the thickness of 1 to 5 nm by, other than spin coating, sputtering or vacuum deposition.

Figure 2B:
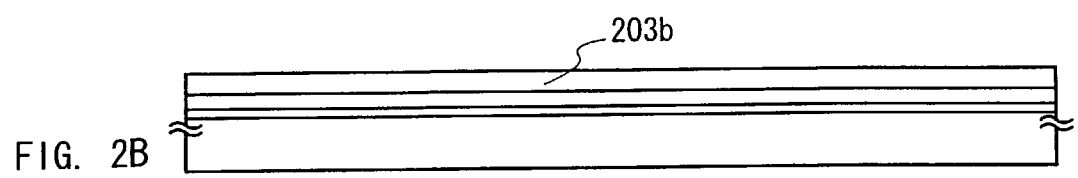
Figure 2C:
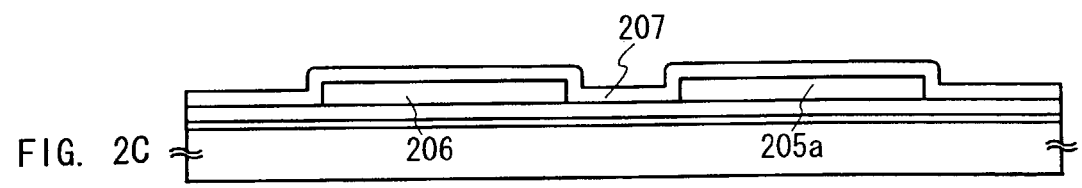
Figure 2D:
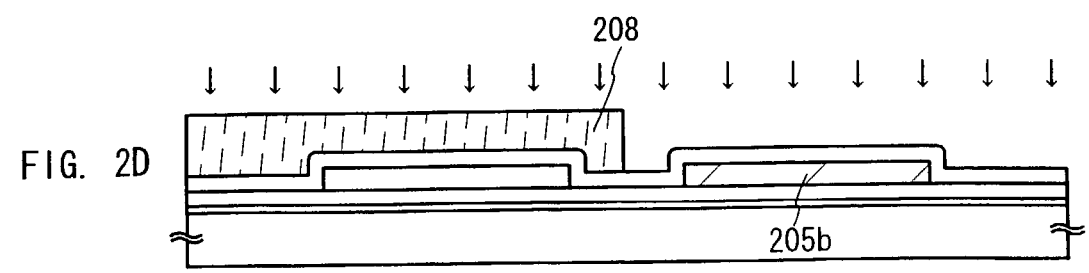

Then, in a crystallizing process illustrated in FIG. 2B, first, heat treatment is performed at 400 to 500° C. for about one hour to make the amount of hydrogen contained in the amorphous silicon film 5 atomic % or less. Then, thermal annealing is performed in a nitrogen atmosphere at 550 to 600° C. for one to eight hours using furnace annealing. By the above process, a crystalline silicon film 203b can be obtained. However, the crystalline silicon film 203b formed by thermal annealing in the above process is, when microscopically observed by a transmission electron microscope or the like, formed of a plurality of crystal grains, with the size and the arrangement of the crystal grains being not even but random. Further, macroscopic observation by Raman spectroscopy and by an optical microscope sometimes reveals that amorphous regions locally exist.

In order to enhance the crystallinity of the crystalline silicon film 203b, it is effective to perform laser annealing at this stage. In laser annealing, since the crystalline silicon film 203b is once melted and then recrystallized, the above object can be attained. For example, a linear beam is formed by an optical system using an XeCl excimer laser (wavelength: 308 nm), and irradiation is performed with the oscillation frequency being 5 to 50 Hz, the energy density being 100 to 500 $mJ/cm^2$, and the overlap ratio of the linear beams being 80 to 98%. In this way, the crystallinity of the crystalline silicon film 203b can be further enhanced.

Then, a photoresist pattern is formed on the crystalline silicon film 203b. By dry etching, the crystalline silicon film is divided into island-like portions to form island-like semiconductor layers 205a and 206 to be an active layer. In the dry etching, a mixed gas of $CF_4$ and $O_2$ is used. After that, a mask layer 207 of a silicon oxide film at the thickness of 50 to 130 nm is formed by plasma enhanced CVD, low pressure CVD, or sputtering. Here, using low pressure CVD, 40 SCCM of $SiH_4$ and 400 SCCM of $NO_2$ are introduced into a reaction chamber, and the mask layer 207 is formed at the thickness of 130 nm with the substrate temperature being 400° C. and the reaction pressure being 2 Torr. (See FIG. 2C)

Then, a photoresist mask 208 is provided. For the purpose of controlling Vth, an impurity element for the p-type is doped in the island-like semiconductor layer 205a forming the n-channel TFT at the concentration of about $1 \times 10^{16}$ to $5 \times 10^{17}$ atoms/$cm^3$. As such an impurity element for giving the p type to a semiconductor, elements which belong to the family XIII of the periodic table such as boron (B), aluminum (Al), and gallium (Ga) are known. Here, diborane ($B_2H_6$) is used to dope boron (B) by ion doping. Doping of boron (B) is not necessarily required, and may be omitted. However, By doping boron (B) in the semiconductor layer 205b, the threshold voltage of the n-channel TFT can be made within a predetermined range. (See FIG. 2D)

In order to form an LDD region of the n-channel TFT, an impurity element for the n type is selectively doped in the island-like semiconductor layer 205b. As such an impurity element for giving the n type to a semiconductor, elements which belong to the group 15 of the periodic table such as phosphorus (P), arsenic (As), and antimony (Sb) are known. After a photoresist mask 209 is formed, here ion doping using phosphine ($PH_3$) is applied to dope phosphorus (P). The concentration of phosphorus (P) in an impurity region 210 to be formed is in the range of $2\times10^{16}$ to $5\times10^{19}$ atoms/$cm^3$. The concentration of the impurity element for the n type contained in the impurity region 210 is herein represented as (n−). (See FIG. 3A)

Figure 3A:
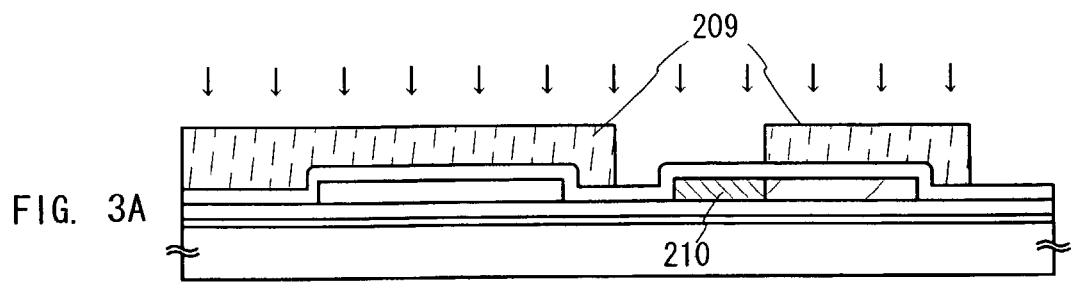
FIG. 3 illustrates the process of forming an n-channel TFT and a p-channel TFT on one substrate.
Figure 3B:
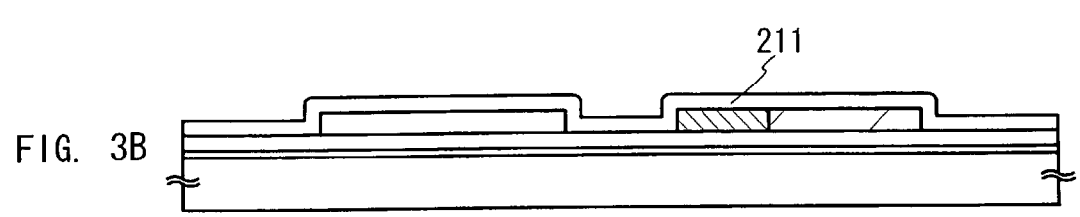
Figure 3C:
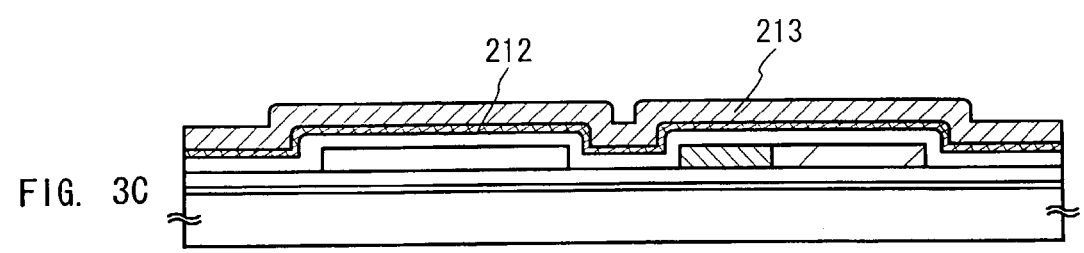
Figure 3D:
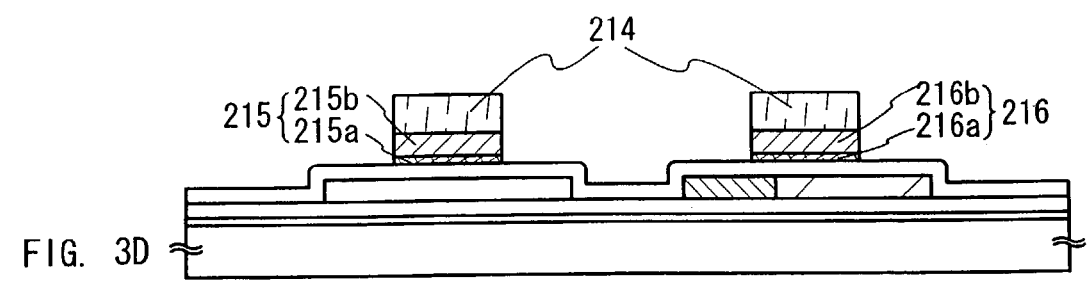
Figure 4A:
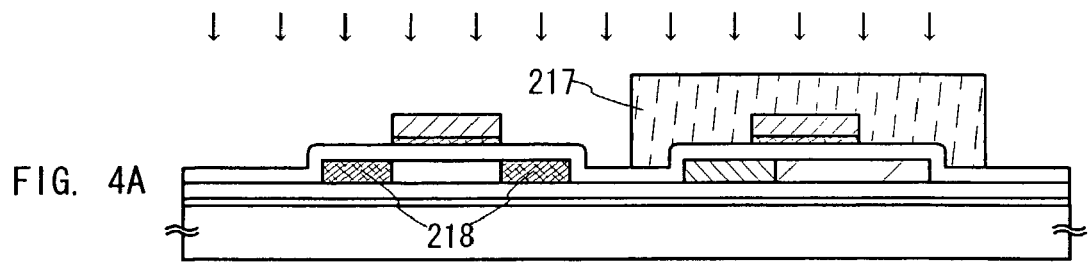
FIG. 4 illustrates the process of forming an n-channel TFT and a p-channel TFT on one substrate.
Figure 4B:
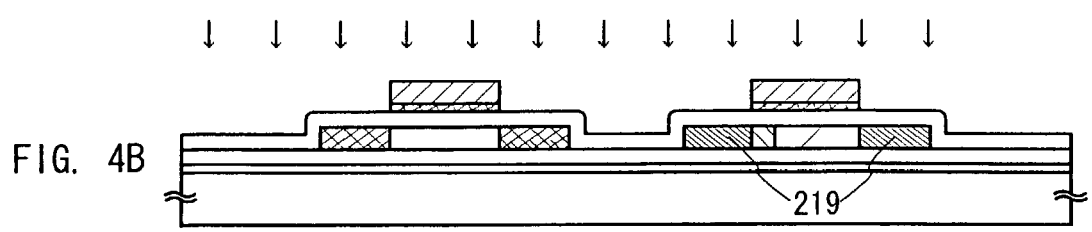
Figure 4C:
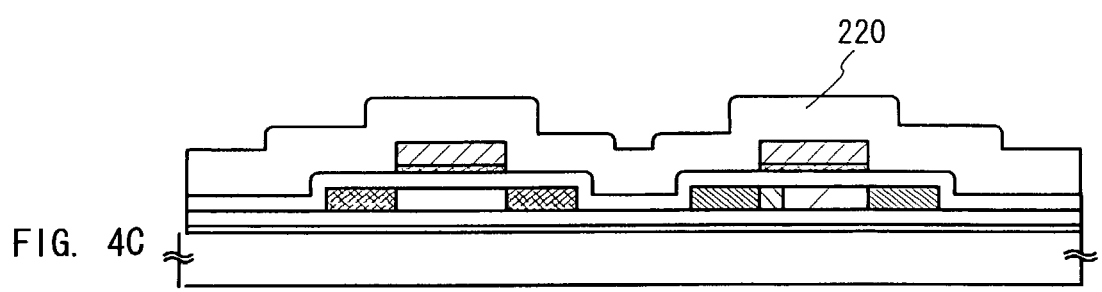
Figure 4D:
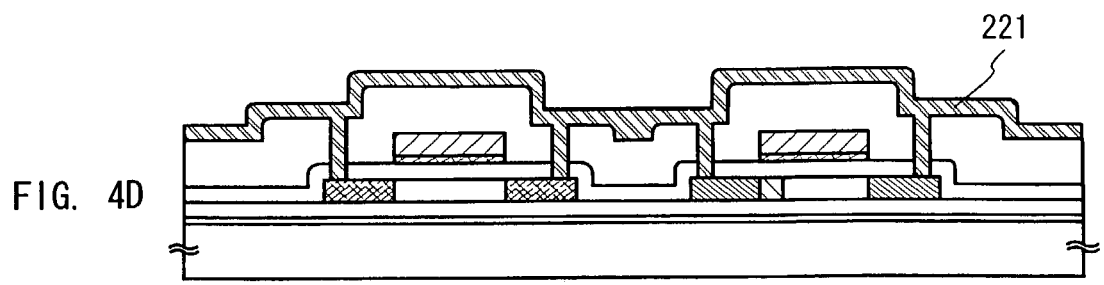

Next, the mask layer 207 is removed by an etchant such as hydrogen fluoride diluted with pure water. Then, as illustrated in FIGS. 3B and 3C, a process of activating the impurity element doped in the island-like semiconductor layer 205b is performed. The activation can be performed by thermal annealing in a nitrogen atmosphere at 500 to 600° C. for one to four hours laser annealing or the like. Or, the above two methods may be used together. In the present embodiment, laser activation is used. A linear beam is formed using a KrF excimer laser (wavelength: 248 nm), and scanning is performed with the oscillation frequency being 5 to 50 Hz, the energy density being 100 to 500 mJ/$cm^2$, and the overlap ratio of the linear beams being 80 to 98% to process the whole surface of the substrate having the island-like semiconductor layers formed thereon. It is to be noted that the conditions of the irradiation of the laser beam is intended to be limited in no way, and they may be appropriately set by those who implement the present invention.

Then, a gate insulating film 211 is formed of an insulating film containing silicon at the thickness of 40 to 150 nm by plasma enhanced CVD. Prior to the formation of the gate insulating film, plasma cleaning is performed. 200 SCCM of H, is introduced, plasma is generated with the reaction pressure being 0.15 Torr, the discharge electric power density being 0.2 W/$cm^2$, and the discharge frequency being 60 MHz, and treatment is performed for two minutes. Alternatively, treatment may be performed by introducing 100 SCCM of $H_2$ and 100 SCCM of oxygen and generating in a similar way plasma with the reaction pressure being 0.3 Torr. The substrate temperature is 300 to 450° C., preferably 400° C. This can remove contaminant such as boron, phosphorus, and organic substances adsorbed on the surface of the island-like semiconductor layers 205b and 206. Further, by simultaneously introducing oxygen and $N_2O$, the outermost surface and the vicinity thereof of the surface where the deposition is formed are oxidized, which has preferable actions such as decrease in the interface state density with the gate insulating film. After the plasma cleaning treatment, continuously, 4 SCCM of $SiH_4$ and 400 SCCM of $N_2O$ are introduced in a reaction chamber, and the gate insulating film 211 is formed in a similar way to the above case of the silicon oxynitride film 202b with the substrate temperature being 400° C., the reaction pressure being 0.3 Torr, the discharge electric power density being 0.41 W/$cm^2$, and the discharge frequency being 60 MHz. (See FIG. 3B)

A conductive layer for forming a gate electrode is formed on the gate insulating film 211. The conductive layer may be a single layer, and may be of a laminated structure having two layers, three layers, or the like as necessary. In the present embodiment, the conductive layer is formed by laminating a conductive layer (A) 212 of a conductive metal nitride film and a conductive layer (B) 213 of a metal film. (See FIG. 3C) The conductive layer (B) 213 is formed of an element selected from the group consisting of tantalum (Ta), titanium (Ti), molybdenum (Mo), and tungsten (W), an alloy containing such an element as the main component thereof, or an alloy which is a combination thereof (representatively, a Mo—W alloy film or a Mo—Ta alloy film). The conductive layer (a) 212 is formed of tantalum nitride (TaN), tungsten nitride (WN), titanium nitride (TiN), molybdenum nitride (MoN), or the like. The conductive layer (A) 212 may also be formed of tungsten silicide, titanium silicide, or molybdenum silicide. It is preferable that the concentration of impurity contained in the conductive layer (B) 213 is decreased for the purpose of lowering the resistance. In particular, with regard to the concentration of oxygen, 30 ppm or less is found to be preferable. For example, with regard to a case of tungsten (W), by making the concentration of oxygen 30 ppm or less, resistivity value of 20 µÙcm or less can be materialized.

The thickness of the conductive layer (A) 212 is 10 to 50 nm (preferably 20 to 30 nm), and the thickness of the conductive layer (B) 213 is 200 to 400 nm (preferably 250 to 350 nm). In the present embodiment, a TaN film at the thickness of 30 nm is formed as the conductive layer (A) 212 and a Ta film at the thickness of 350 nm is formed as the conductive layer (B) 213, both by sputtering. The TaN film is formed using mixed gas of Ar and nitrogen as a sputtering gas, with Ta being as a target. The Ta film is formed using Ar as a sputtering gases. By adding an adequate amount of Xe or Kr in these sputtering gas, internal stress of the films can be alleviated to prevent peeling off of the films. The resistivity of the Ta film in an a phase is 20 µÙcm, which is appropriate for use as the gate electrode, while the resistivity of the Ta film in a âphase is 180 µÙcm, which is inappropriate for use as the gate electrode. Since the TaN film has a crystal structure similar to that of the á phase, by forming the Ta film on the TaN film, a Ta film in an á phase can be easily obtained. It is to be noted that, though not shown in the figure, it is effective to form under the conductive layer (A) 212 a silicon film at the thickness of about 2 to 20 nm with phosphorus (P) doped therein. This can improve the adhesion of and prevent oxidation of the conductive film to be formed thereon, and can also prevent a very small amount of an alkali metal element in the conductive layers (A) and (B) from diffusing into the gate insulating film 211. In any case, it is preferable that the resistivity of the conductive layer (B) is in the range of 10 to 500 µÙcm.

Then, a photoresist mask 214 is formed, and the conductive layer (A) 212 and the conductive layer (B) 213 are etched together to form gate electrodes 215 and 216. For example, the gate electrodes 215 and 216 can be formed by dry etching using a mixed gas of $CF_4$ and $O_2$ or using $Cl_2$ with the reaction pressure being 1 to 20 Pa. The gate electrodes 215 and 216 are formed of 215a and 216a of the conductive layer (A) and 215b and 216b of the conductive layer (B), respectively, which are integral with each other. Here, the gate electrode 216 of the n-channel TFT is formed so as to overlap the impurity region 210 through the gate insulating film 211. It is also possible to form the gate electrodes only of the conductive layer (B). (See FIG. 3D)

Then, impurity regions 218 to be a source region and a drain region of the p-channel TFT are formed. Here, an impurity element for the p type is doped using the gate electrode 215 as a mask to form the impurity region in a self-aligning manner. (See FIG. 4A) Here, the island-like semiconductor layer forming the n-channel TFT is covered with a photoresist mask 217. The impurity region 218 is formed by ion doping using diborane ($B_2H_6$) such that the concentration of boron (B) in these areas is $3\times10^{20}$ to $3\times10^{21}$ atoms/cm$^3$. The concentration of the impurity element for the p type contained in the impurity regions 218 formed here is herein represented as (p+).

Then, impurity regions 219 for forming a source region and a drain region of the n-channel TFT is formed. Here, the impurity regions 219 are formed by ion doping using phosphine ($PH_3$) such that the concentration of phosphorus (P) in these areas is $1\times10^{20}$ to $1\times10^{21}$ atoms/cm$^3$. The concentration of the impurity element for the n type contained in the impurity regions 219 formed here is herein represented as (n+). Though phosphorus (P) is simultaneously doped also in the impurity regions 218, since the concentration of phosphorus (P) doped in the impurity regions 218 is ½ to ⅓ of the concentration of boron (B) doped in the previous process, the conductivity of the p type can be secured with no influence on the characteristics of the TFT. (See FIG. 4B)

After that, a silicon oxynitride film is formed to form an interlayer insulating film 220. (See FIG. 4C) More specifically, 27 SCCM of $SiH_4$ and 900 SCCM of $N_2O$ are introduced into a reaction chamber, and the silicon oxynitride film is formed at the thickness of 500 to 1500 nm (preferably 600 to 800 nm) with the substrate temperature being 400° C., the reaction pressure being 1.2 Torr, the discharge electric power density being 0.14 W/cm$^2$, and the discharge frequency being 13.56 MHz.

Then, contact holes reaching the source and drain regions of the TFTs are formed in the interlayer insulating film 220, and a silicon film containing an impurity element belonging to the group 15 of the periodic table is formed. (See FIG. 4D) Here, phosphorus is selected as such an impurity element belonging to the group 15 of the periodic table, and a silicon film containing $1\times10^{19}$ atoms/cm$^3$ or more of phosphorus is formed to form a gettering layer 221. The gettering layer 221 may be formed by any of plasma enhanced CVD, low pressure CVD, and sputtering, and the silicon film may be any of an amorphous silicon film, microcrystalline silicon film, and a crystalline silicon film. Further, in the p-channel TFT, a pn junction is formed by the contact of the impurity region of the semiconductor layer with the gettering layer 221 at a contact portion with the semiconductor layer. However, since the concentration of the impurity in the impurity region of the semiconductor layer at the contact portion is high, by making high the concentration of phosphorus contained in the gettering layer 221, the junction becomes a tunnel junction, and thus, a low contact resistance can be obtained. Therefore, no problem arises at the contact portion.

Then, thermal activation is performed at 400 to 800° C. (preferably 500 to 600° C.). The thermal activation makes the gettering layer 221 function as a gettering site through the source contact and the drain contact, and thus, the metallic element promoting crystallization which remains in the semiconductor layers 205 and 206 can be gettered, and the concentration of the metallic element in the semiconductor layers can be decreased to a detection limit or lower, or to an extent which does not influence the electric characteristics of the TFTs. Since the gettering layer 221 exists on the whole surface of the substrate, the whole surface of the substrate functions as the gettering site, and a high gettering efficiency can be obtained. Further, this thermal activation process also activates the impurity elements for the n type and for the p type doped at their respective concentrations. More specifically, the thermal activation process is performed using furnace annealing.

After the activating process, further, heat treatment is performed in an atmosphere containing 3 to 100% of hydrogen at 300 to 500° C. for one to twelve hours to hydrogenate the island-like semiconductor layers. This process is a process to terminate dangling bonds in the semiconductor layer with thermally excited hydrogen. As another hydrogenating means, plasma hydrogenation (hydrogen excited by plasma is used) may also be performed.

Figure 5A:
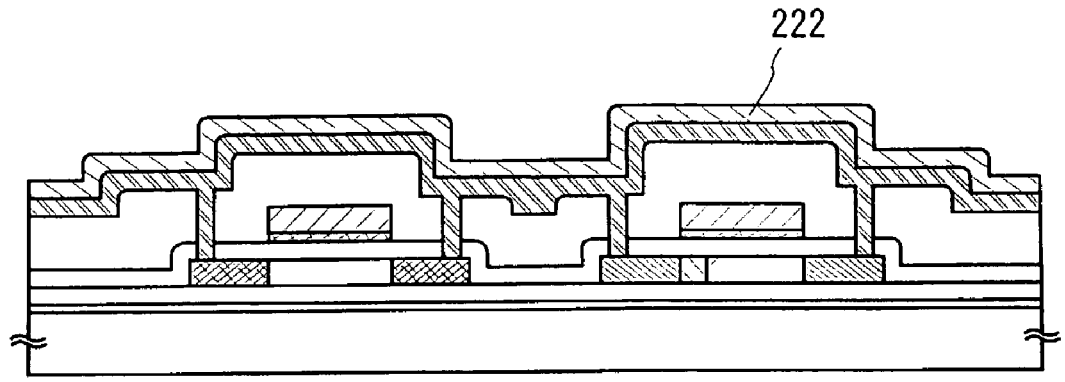
FIG. 5 illustrates the process of forming an n-channel TFT and a p-channel TFT on one substrate.
Figure 5B:
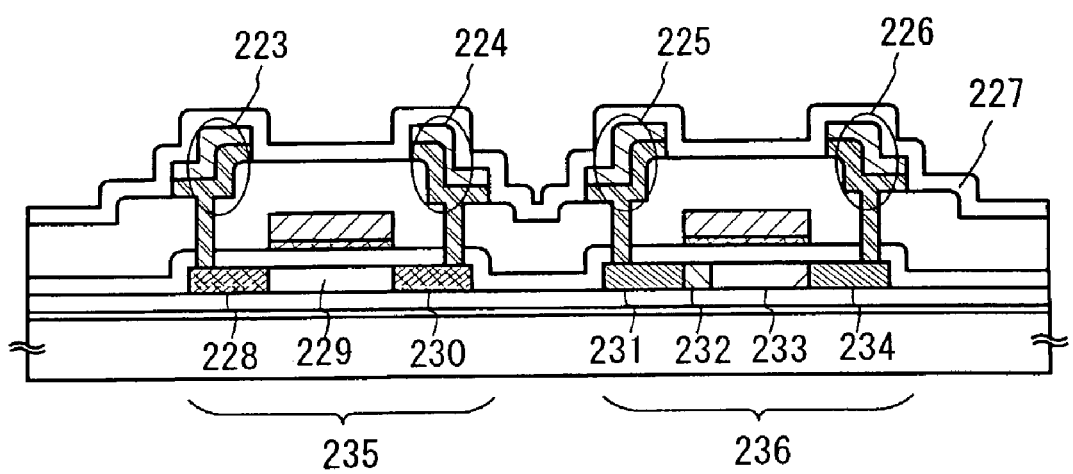
Figure 6A:
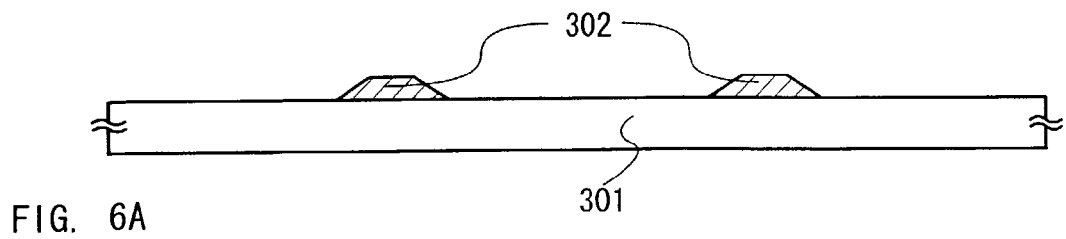
FIG. 6 illustrates a process of forming a reverse stagger type n-channel TFT and a reverse stagger type p-channel TFT on one substrate.
Figure 6B:
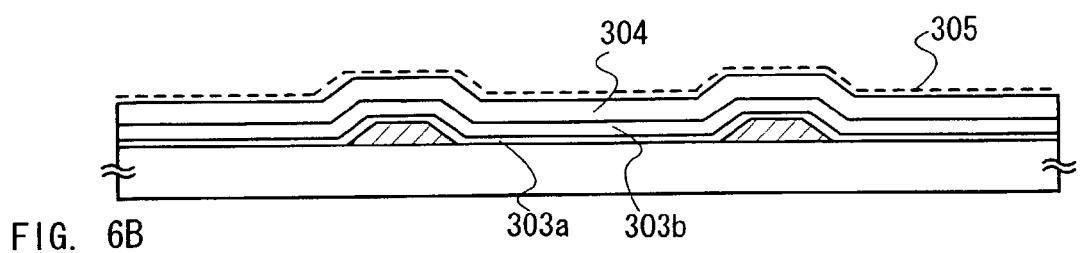
Figure 6C:
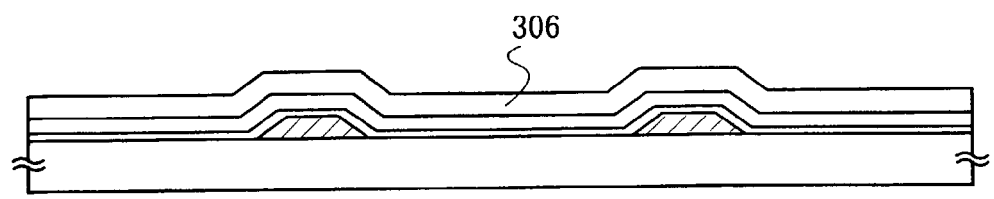
Figure 6D:
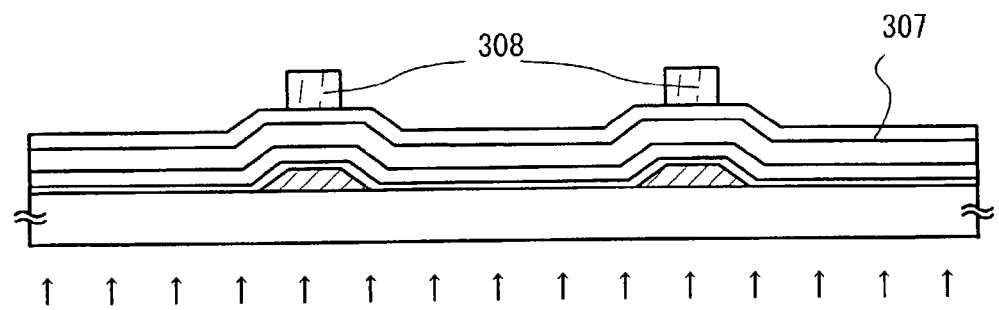
Figure 7A:
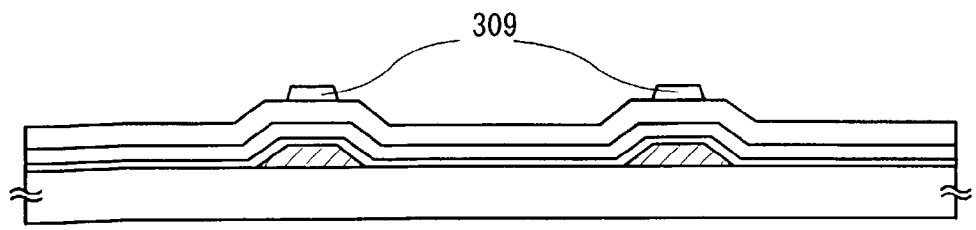
FIG. 7 illustrates the process of forming a reverse stagger type n-channel TFT and a reverse stagger type p-channel TFT on one substrate.
Figure 7B:
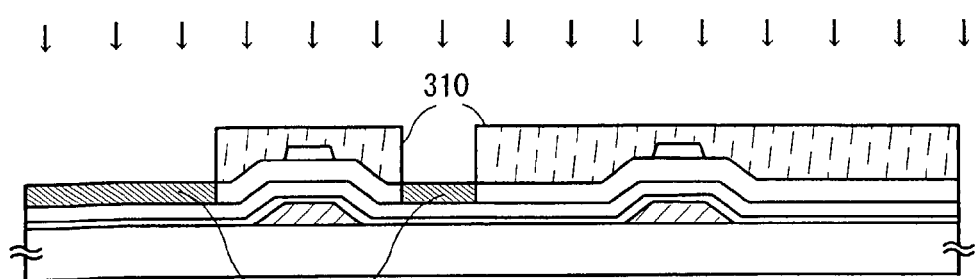
Figure 7C:
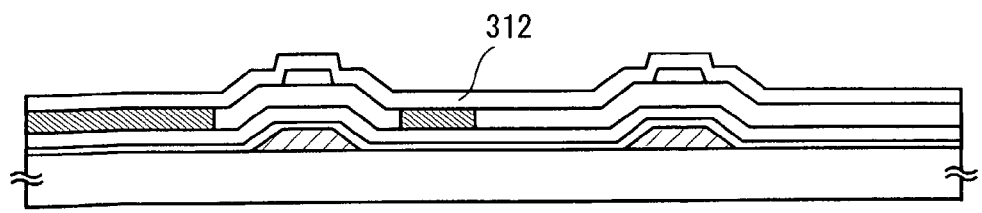
Figure 7D:
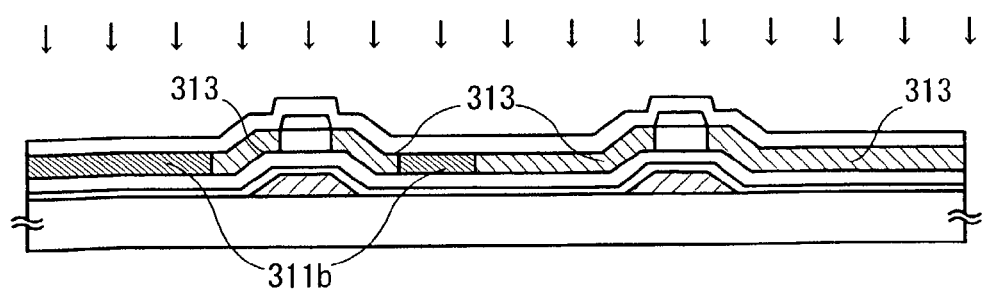
Figure 8A:
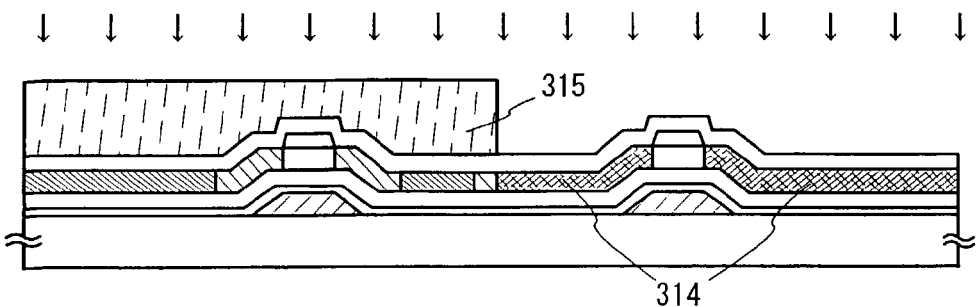
FIG. 8 illustrates the process of forming a reverse stagger type n-channel TFT and a reverse stagger type p-channel TFT on one substrate.
Figure 8B:
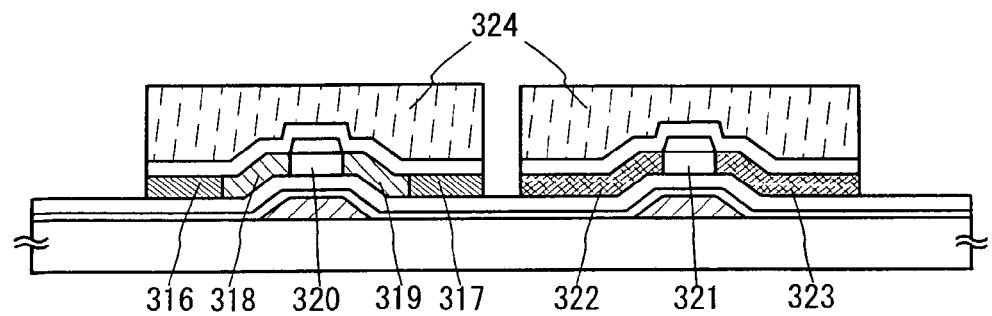
Figure 8C:
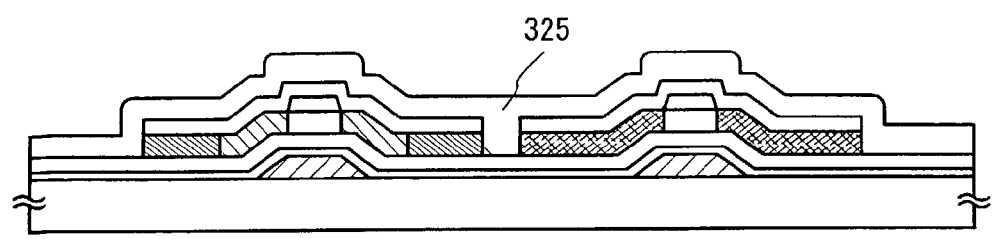
Figure 8D:
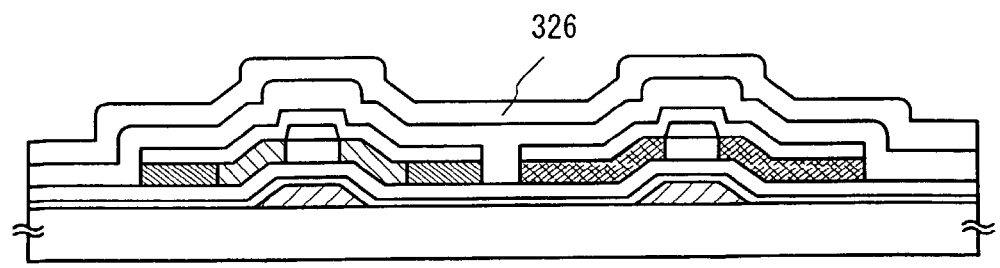
Figure 9A:
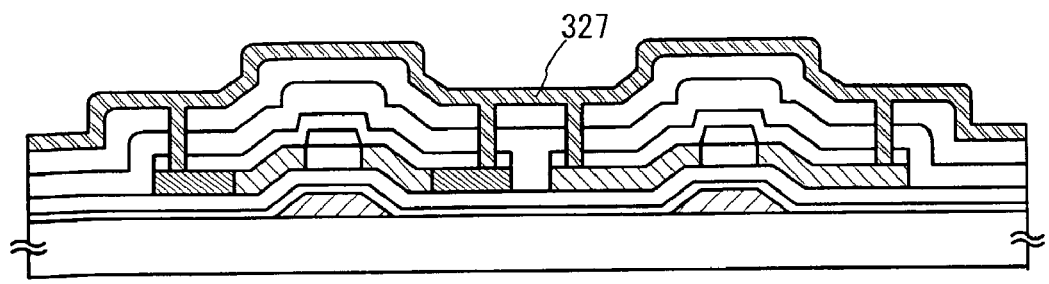
FIG. 9 illustrates the process of forming a reverse stagger type n-channel TFT and a reverse stagger type p-channel TFT on one substrate.
Figure 9B:
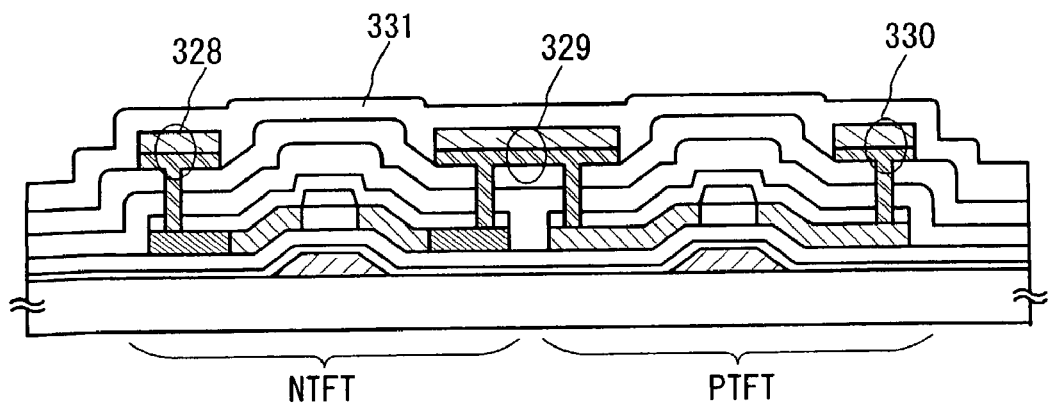
Figure 13A:
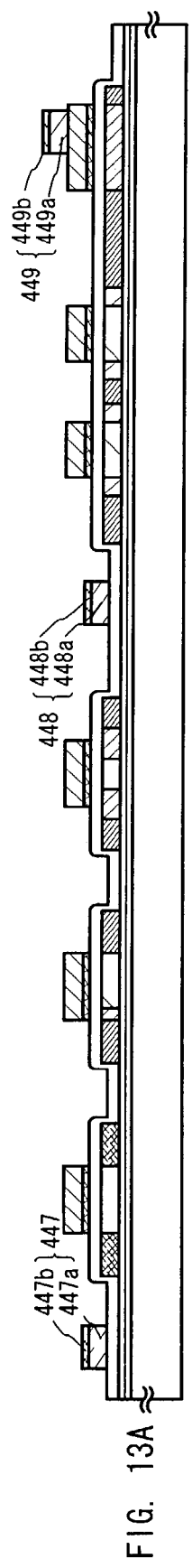
FIG. 13 illustrates the process of forming a pixel TFT and a driver circuit TFT on one substrate.
Figure 13B:
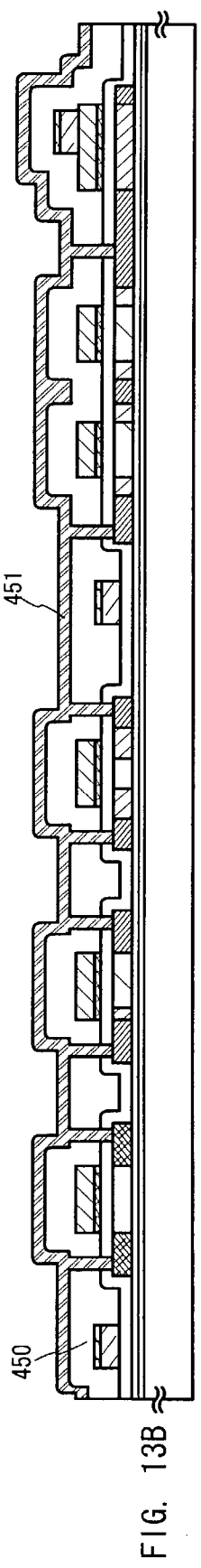
Figure 13C:
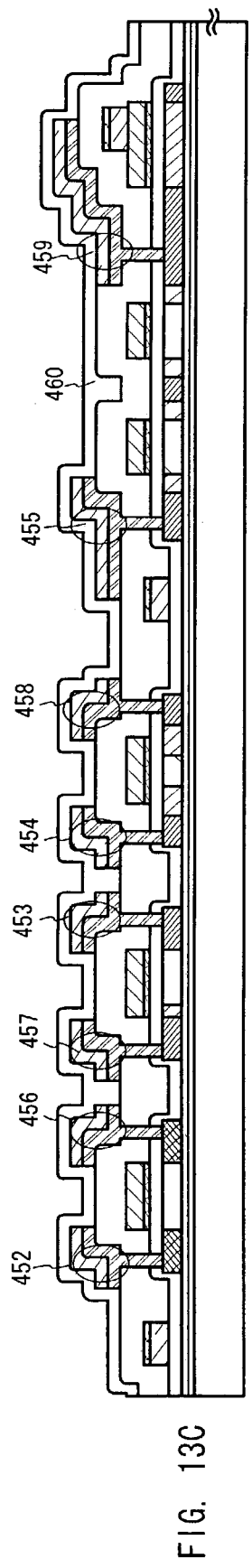

After that, a second conductive layer 222 is formed as illustrated in FIG. 5A. The second conductive layer may be a laminated layer so as to prevent a hillock and oxidation. Then, as illustrated in FIG. 5B, the second conductive layer 222 is patterned to function as a part of source wirings 223 and 226 and drain wirings 224 and 225. After that, the gettering layer 221 is etched in a self-aligning manner using as a mask the patterned second conductive layer 222 to make the gettering layer 221, together with the second conductive layer 222, function as a part of source wirings 223 and 226 and drain wirings 224 and 225.

Then, as a passivation film 227, a silicon nitride film or a silicon oxynitride film is formed at the thickness of 50 to 500 nm (representatively 100 to 300 nm). By performing hydrogenation in this state, a preferable result can be obtained with regard to improvement in the characteristics of the TFTs. For example, thermal annealing is performed in an atmosphere containing 3 to 100% of hydrogen at 300 to 500° C. for one to twelve hours.

In this way, an n-channel TFT 236 and a p-channel TFT 235 can be completed on the substrate 201. The p-channel TFT 235 has in its island-like semiconductor layer 206 a channel forming region 229, a source region 228, and a drain region 230. The n-channel TFT 236 has in its island-like semiconductor layer 205 a channel forming region 233, an LDD region 232 (hereinafter such an LDD region is denoted as Lov) overlapping the gate electrode 216, a source region 234, and a drain region 231. The length of the Lov region in the channel length direction is 0.5 to 3.0 µm (preferably 1.0 to 1.5 µm) while the channel length is 3 to 8 µm. Though, in the present embodiment, the respective TFTs are of a single gate structure, they may be of a double gate structure, or of a multi gate structure provided with more than two gate electrodes.

Through the above processes, the n-channel TFT and the p-channel TFT necessary for forming a CMOS circuit can be formed on the one substrate.

[Embodiment 2]

Embodiment 2 is explained about the example of application of the gettering to manufacturing method of a reversed structure TFT with references to FIGS. 6A to 9D.

First, a glass substrate, for example a Corning Corp. #1737 substrate, is prepared as a substrate 301. Gate electrodes 302 is then formed on the substrate 301. Sputtering is used here to form a tantalum (Ta) film with a thickness of 200 nm. Further, a two layer structure of a tantalum nitride (TaN) film (film thickness 50 nm) and a tantalum (Ta) film (film thickness 250 nm) may be used as the gate electrode 302. The Ta film is formed by sputtering using Ar gas and with Ta as a target, and if sputtering is performed with a gas mixture in which Xe gas is added to the Ar gas, then the absolute value of the internal stress can be made to be $2\times10^8$ Pa or less. (See FIG. 6A)

A gate insulating film and an amorphous silicon layer 304 as an amorphous semiconductor layer are then formed in order successively, without exposure to the atmosphere. The gate insulating film is form of a nitrogen rich silicon oxynitride film 303a formed by plasma CVD with a thickness of 25 nm, and a oxygen rich silicon oxynitride film 303b formed on top to a thickness of 125 nm. As same as Embodiment 1, the crystallinity is performed by using a metallic element which improve the crystallinity. First, the layer 305 containing the metallic element is formed by a spin coat method, a sputtering method and a vacuum evaporation method. (See FIG. 6B)

Heat treatment is then performed for one hour at 450 to 550° C. using an annealing furnace. Hydrogen is released from the amorphous semiconductor layer 304 through the heat treatment, so that the amount of hydrogen remaining is reduced to 5 atomic % or less. A crystalline silicon film 306 is attained by performing the heat treatment for 1 to 8 hours at 550 to 600° C. using an annealing furnace in a nitrogen atmosphere. (See FIG. 6C) The laser annealing method is performed effectually for decreasing the amorphous regions which remains locally and thus high crystallization can be realized.

A hydrogenated silicon oxynitride film 307, for channel protective insulating film, is formed with a thickness of 200 nm next in close contact with the crystalline semiconductor layer 306. After that, resist masks 308 formed next in contact with the silicon oxynitride film 307 patterning using back face exposure. The gate electrodes 302 here serve as masks, and the resist masks 308 are formed in a self-aligning manner. As shown in the figures, the size of the resist masks becomes slightly smaller than the width of the gate electrodes due to wraparound of light. (See FIG. 6D)

The hydrogenated silicon oxynitride film 307 is etched using the resist masks 308 and after forming the channel protective insulating films 309, the resist masks 308 are removed. The surface of the regions of the crystalline silicon film 306 which are not in contact with the channel protective insulating films 309 are exposed at this step. Along with fulfilling a role of preventing the addition of impurities to the channel forming region during a later impurity addition step, the channel protective insulating films 309 are effective in reducing the interface level density of the crystalline silicon film. (See FIG. 7A)

Next, a resist mask 310 is formed covering a p-channel TFT and a portion of an n-channel TFT by patterning using a photomask, and a step of doping an impurity element which imparts n-type conductivity to the exposed regions of the surface of the crystalline silicon film 306 is performed. The $n^+$ regions 311a are then formed. Phosphorus (P) is added here by ion doping using phosphine ($PH_3$), with a dosage of $5\times10^{14}$ atoms/cm$^2$ and an acceleration voltage of 10 keV. Furthermore, the pattern of the above resist masks 310 determines the width of the $n^+$ regions by being suitably set by the operator, and it is also possible to make an $n^-$ region and a channel forming region with a desired width. (See FIG. 7B)

After removing the resist masks 310, a protective insulating film 312 is formed. This film is also formed of a silicon oxynitride film 307 manufactured with a thickness of 50 nm. (See FIG. 7C) A step of adding an impurity element which imparts n-type conductivity to the crystalline silicon film, on which the protective insulating film 312 is formed, is performed next, forming $n^-$ regions 313. Note that it is necessary to consider the thickness of the protective insulating film 312 and set suitable conditions in order to add the impurity through the protective insulating film 312 and into the crystalline silicon film below the film. The dosage is set to $3\times10^{13}$ atoms/cm$^2$ and the acceleration voltage is set to 60 keV here. The $n^-$ regions 313 thus formed function as LDD regions. (See FIG. 7D)

A resist mask 315 is formed next, covering the n-channel TFT, and a step of adding an impurity element which imparts p-type conductivity to the region in which the p-channel TFT is formed is performed. Boron (B) is added here by ion doping using diborane ($B_2H_6$). The dosage is set to $4\times10^{15}$ atoms/cm$^2$ and the acceleration voltage is set to 30 keV, forming a $p^+$ region. (See FIG. 8A) The channel forming regions 309 and the protective insulating films 312 are left as is, and the crystalline silicon film is etched into a desired shape by a known patterning technique. (See FIG. 8B)

Thus, through the above steps, a source region 316, a drain region 317, LDD regions 318 and 319, and a channel forming region 320 are formed in the n-channel TFT, and a source region 322, a drain region 323, and a channel forming region 321 are formed in the p-channel TFT. Next, a first interlayer insulating film 325 is formed with a thickness of between 100 to 500 nm covering the n-channel TFT and the p-channel TFT. (See FIG. 8C) A second interlayer insulating film 326 is then formed to a similar thickness of 100 to 500 nm of a hydrogenated silicon oxynitride film manufactured. (See FIG. 8D)

The first interlayer insulating film 325 and second interlayer insulating film 326 are thereafter formed with predetermined resist masks, and provided with contact holes reaching the source regions and drain regions of the respective TFTs by an etching process. As Embodiment 1, phosphorus is elected as in the periodic table group 15 and the silicon film containing phosphorus at a concentration of $1\times10^{19}$ is deposited to form and the gettering layer 327 is formed. As the forming method, whichever can be used among the plasma CVD method, the low pressure method and the sputtering method. Whichever can be used among the amorphous silicon film, microcrystalline silicon film and the crystalline silicon film. After that, residual metallic element in the crystalline silicon film 306 is gettered with high efficiency by heat activation step same as Embodiment 1. The heat activation step is performed at 400 to 800° C. (preferably at 500 to 600° C.) The step of the heat treatment needs to be performed for activating the impurity elements which bestow the n-conductivity type and the p-conductivity type and which have been introduced at the individual concentrations. When the gettering layer 327 is formed as an amorphous silicon film or microcrystal silicon film, the gettering layer 327 will be a crystalline silicon film. After the activation step, additional heat treatment is performed for 1 to 12 hours at 300 to 500° C. in an atmosphere containing hydrogen of between 3 and 100%, the step of hydrogenating the island semiconductor layers can be added to terminating the dangling bond of the semiconductor layer. Plasma hydrogenation (using hydrogen excited by a plasma) may be performed as another means of hydrogenation. (See FIG. 9A)

After that, the second conductive layer is formed. The second conductive layer can be used to restrict the occurrence of hillocks and oxidation. The second conductive layer is patterned to function as a part of source wiring 328, 330 and drain wiring 329 and the gettering layer 327 is etched in a self alignment manner using the second conductive layer as a mask. And the gettering layer 327 is made function as a part of source wiring 328, 330 and drain wiring 329 with the second conductive layer. (See FIG. 9B)

In addition, a step of forming a passivation film 331 is performed. The passivation film is made by plasma CVD from a silicon oxynitride film formed using $SiH_4$, $N_2O$, and $NH_3$, or from a silicon nitride film manufactured by using $SiH_4$, $N_2$, and $NH_3$. A plasma hydrogenation process is performed first, before forming the film, by introducing a substance such as $N_2O$, $N_2$, or $NH_3$. The hydrogen made into a plasma in the gas phase is supplied into the second interlayer insulating film, and if the substrate is heated to between 200 and 500° C., then the hydrogen can also be made to diffuse into the first interlayer insulating film and to layers below the first interlayer insulating film, thereby carrying out a second hydrogenation step. The manufacturing conditions of the passivation film are not in particular limited, but it is preferable to form a dense film. Finally, a third hydrogenation step is performed by performing heat treatment for 1 to 12 hours at between 300 and 550° C. in an atmosphere containing hydrogen or nitrogen. At this point, hydrogen diffuses from the passivation film 331 to the second interlayer insulating film 326, from the second interlayer insulating film 326 to the first interlayer insulating film 325, and from the first interlayer insulating film 325 to the crystalline silicon film, and hydrogenation of the crystalline silicon-film can effectively be carried out. Hydrogen also is released into the gas phase from within the films, but a dense passivation film prevent the release to a certain extent. If hydrogen has been supplied into the heat treatment atmosphere, then this can compensate for the hydrogen released.

The p-channel TFT and the n-channel TFT of reverse stagger type structure can thus be formed on the same substrate through above steps.

[Embodiment 3]

A detailed explanation is made of a method of manufacturing a pixel TFT of a pixel portion, and driver circuit TFTs formed in the periphery of the pixel portion using FIGS. 10 to 14. Note that, in order to simplify the explanation, a CMOS circuit, which is the basic circuit for control circuits such as a shift register circuit and a buffer circuit, and an n-channel TFT forming a sampling circuit are shown in the figures.

As shown in FIG. 10A, a base insulating film denoted 401 is formed on the insulating substrate. For example, a 1737 glass substrate of Coning Co. is used for the insulating substrate 401. On the glass substrate are formed a laminated layer film of a silicon oxynitride film 402a with a thickness of 50 nm in which the composition ratio of $SiH_4$, $N_2O$ and $NH_3$ and a silicon oxynitride film 402b with a thickness of 100 nm in which the composition ratio of $SiH_4$ and $N_2O$ as a base insulating film 402 for preventing the diffusion of impurities from the substrate.

An amorphous silicon film 403a as an amorphous semiconductor layer is formed next, with a thickness of between 25 and 80 nm (preferably between 30 and 60 nm), by a known method such as plasma CVD or sputtering. In embodiment 3, an amorphous silicon film is formed to have a thickness of 55 nm by plasma CVD. The base film 402 and the amorphous silicon film 403a may both be formed successively, because a same method is applied to both layers. By not exposing the surface to the atmosphere after forming the base film 402, it becomes possible to prevent contamination of the surface, and dispersion in the characteristics of the manufactured TFT, and fluctuations in the Vth, can be reduced.

Using the metallic element for crystallization same as Embodiment 1, an aqueous solution containing 10 ppm by weight of a metallic element is applied by spin coating, forming a layer containing the metallic element (not shown in the figures) on an amorphous silicon film 403a. Elements such as iron (Fe), cobalt (Co), nickel (Ni), ruthenium (Ru), rhodium (Rh), palladium (Pd), osmium (Os), iridium (Ir), platinum (Pt), copper (Cu), gold (Au), germanium (Ge), lead (Pb) and indium (In) may be used as the metallic element. In the crystallization process, heat treatment is first performed for approximately 1 hour at between 400 and 500° C., making the amount of hydrogen contained in the amorphous silicon film 5 atomic % or less. This makes it possible to prevent the surface of the film from being coarsened. When the amorphous silicon film is formed by the plasma CVD method by using $SiH_4$ and Ar as reaction gases maintaining the temperature of the substrate at 300° C. to 400° C., the hydrogen concentration in the amorphous silicon film can be suppressed to be not larger than 5 atomic %. In such a case, no dehydrogenation treatment is necessary. Thermal annealing is then performed in a nitrogen atmosphere at 550 to 600° C. for 1 to 8 hours using an annealing furnace. A crystalline silicon film can thus be obtained through the above processes. The concentration of the catalytic element remaining in the surface in this state is between $3 \times 10^{10}$ and $2 \times 10^{11}$ atoms/cm$^3$. Laser annealing may also be performed in conjunction with thermal annealing in order to improve the crystallization ratio. Then the crystalline semiconductor layer 403b made of crystalline silicon film is formed. (See FIG. 10B.)

The crystalline silicon film is then patterned into island-shapes, forming p-channel TFT's active layer 404 of the CMOS circuit, n-channel TFT's active layer 405, n-channel TFT's active layer 406 forming sampling circuit and active layer 407 of the pixel circuit by dry etching. A mask layer 408 by a silicon oxide film is then formed by plasma CVD, reduced pressure CVD, or sputtering to a thickness of between 50 and 100 nm. For example, a silicon oxide film is formed by reduced pressure CVD using a mixed gas of $SiH_4$ and $O_2$ and heated to 400° C. at a pressure of 266 Pa. (See FIG. 10C.)

Channel doping is then performed. A photoresist mask 409 is formed first, and boron (B) is added as an impurity element that imparts p-type conductivity to the entire surface of the island-shape semiconductor layers 405 to 407, at a concentration about $1 \times 10^{16}$ to $5 \times 10^{17}$ atoms/cm$^3$, with the aim of controlling the Vth. Ion doping may be used for the addition of boron (B), and boron (B) can be added at the same time as the amorphous silicon film is formed. It is not always necessary to add boron (B) here, but it is preferable to form semiconductor layers 410 to 412 with added boron in order to place the Vth of the n-channel TFT within a predetermined range. (See FIG. 10D.)

In order to form an LDD region of the n-channel TFT of the driver circuit, an impurity element that imparts n-type conductivity is selectively added to the island-shape semiconductor layers 410 and 411. Photoresist masks 413 to 416 are formed in advance for this purpose. Phosphorous (P) must be added here, and ion doping using phosphine ($PH_3$) is applied. The phosphorous (P) concentrations of formed impurity regions (n⁻) 417 and 418 are set to between $1 \times 10^{17}$ and $5 \times 10^{18}$ atoms/cm$^3$, respectively. Further, an impurity region 419 is a semiconductor layer for forming a storage capacitor in the pixel portion, and phosphorous (P) is added to this region at the same concentration. (See FIG. 11A.)

The mask layer 408 is removed next by a substance such as hydrofluoric acid, and a process of activating the impurity elements added by the steps of FIG. 10D and FIG. 11A is performed. The activation can be performed by thermal annealing for 1 to 4 hours at between 500 and 600° C., or by laser annealing. Further, both methods may be performed together. Laser activation is used in embodiment 3, and KrF excimer laser light (wavelength 248 nm) formed into a linear shape beam is used, with an oscillation frequency of 5 to 50 Hz and the energy density set to between 100 and 500 mJ/cm$^2$, and this is scanned with an overlap ratio for the linear shape beam of 80 to 98%, processing the entire surface of the substrate on which the island-shape semiconductor layers are formed. Note that there are no specific limitation placed on the laser light irradiation conditions, and that the operator may set them suitably.

A gate insulating film 420 is then formed to a thickness of between 50 and 150 nm using plasma CVD. Before forming the gate insulating film, when the plasma cleaning is performed, it works to clean the to-be-deposited surface of the gate insulating film 420 and the island-shape semiconductor layers 404 and 410 to 412 and works to lower the interfacial level density effecting the electrical characteristics of TFT. The pretreatment further works to lower the interfacial level density by oxidizing the ro-be-deposited surface and the vicinities of the island-shape semiconductor layers 404 and 410 to 412. The gate insulating film 420 is formed continuously by the plasma cleaning. (See FIG. 11B.)

A first conducting layer is formed next in order to form a gate electrode. A conducting layer (A) 421 made from a metallic nitride film having conductivity, and a conducting layer (B) 422 made from a metallic film are laminated in embodiment 3. The conducting film (B) 422 is formed by tantalum (Ta) to a thickness of 250 nm, and the conducting layer (A) 421 is formed from tantalum nitride (TaN) to a thickness of 50 nm, by sputtering using Ta as a target. (See FIG. 11C.)

Photoresist masks 423 to 427 are formed next, and the conducting layer (A) 421 and the conducting layer (B) 422 are etched at the same time, forming gate electrodes 428 to 431 and a capacitor wiring 432. The gate electrodes 428 to 431 and the capacitor wiring 432 are formed, respectively, as a single body from conducting layers (A) 428a to 432a and conducting layers (B) 428b to 432b. The gate electrodes 429 and 430 formed in the driver circuit are formed to overlap a part of the impurity regions 417 and 418, through the gate insulating film 420, at this point. (See FIG. 11D.)

Next, in order to form a source region and a drain region of the p-channel TFT of the driver circuit, a process of adding an impurity element that imparts p-type conductivity is performed. Impurity regions are formed in a self-aligning manner here with the gate electrode 428 as a mask. The region in which the n-channel TFT is formed is covered with a photoresist mask 433. An impurity region (p$^+$) 434 at a concentration of 1×10$^{21}$ atoms/cm$^3$ is then formed by ion doping using diborane (B$_2$H$_6$). (See FIG. 12A.)

Formation of impurity regions for functioning as a source region or a drain region of the n-channel TFT is performed next. Resist masks 435 to 437 are formed, and an impurity element that imparts n-type conductivity is added, forming impurity regions 438 to 441. This is performed by ion doping using phosphine (PH$_3$), and the concentration of the impurity regions (n$^+$) 438 to 441 is set to 5×10$^{20}$ atoms/cm$^3$. (See FIG. 12B.)

A process of adding an impurity that imparts n-type conductivity is then performed in order to form an LDD region of the n-channel TFT of the pixel portion. An impurity element that imparts n-type conductivity is added by ion doping in a self-aligning manner using the gate electrode 431 as a mask. The concentration of phosphorous (P) added is set to 5×10$^{16}$ atoms/cm$^3$, and this is a lower concentration than that of the impurity elements added by the steps of FIG. 11A, FIG. 12A, and FIG. 12B, and in practice only impurity regions (n$^-$) 443 and 444 are formed. Boron (B) is already contained in the impurity region 442 in a previous step, but in comparison, phosphorous (P) is added with a low concentration of the boron (B), and therefore the influence of phosphorous (P) need not be considered, and there is no influence imparted to the characteristics of the TFT. (See FIG. 12C.)

Next, a second conducting layer to be a gate wiring is formed. After the activation and hydrogenation processes are completed, a second conducting layer is formed as a gate wiring. The second conducting layer is formed by a conducting layer (D) made from a low resistance material which has aluminum (Al) or copper (Cu) as its principal constituent. Whichever is used, the resistivity of the second conducting layer is set to between 0.1 and 10 μΩcm. In addition, a conducting layer (E) made from titanium (Ti), tantalum (Ta), tungsten (W), or molybdenum (Mo) may be laminated with the conducting layer (D). In embodiment 3, an aluminum (Al) film containing between 0.1 and 2% titanium (Ti) is formed as conducting layer (D) 445, and a titanium (Ti) film is formed as a conducting layer (E) 446. The conducting layer (D) 445 may be formed with a thickness of 200 to 400 nm (preferably 250 to 350 nm), and the conducting layer (E) 446 may be formed with a thickness of 50 to 200 nm (preferably 100 to 150 nm). (See FIG. 12D.)

The conducting layer (E) 446 and the conducting layer (D) 445 are then etched in order to form a gate wiring connected to the gate electrode, forming gate wirings 447 and 448 and a capacitor wiring 449. In the etching process, dry etching using a mixed gas of SiCl$_4$, Cl$_2$ and BCl$_3$ is performed first, removing a volume from the surface of the conducting layer (E) to the middle of the conducting layer (D). By then removing the conducting layer (D) by wet etching using a phosphoric acid solution, the selectivity with the base film is maintained and the gate wiring can be formed. (See FIG. 13A)

The first interlayer insulating film 450 is formed with oxinitride silicon film with the thickness between 500 to 1500 nm. The contact hole is formed reaching the source regions and drain regions of the respective island-shape semiconductor layers. As Embodiments 1 and 2, the silicon film is formed containing phosphorous at a concentration of 1×10$^{19}$ atoms/cm$^3$, and the gettering layer 451 is formed. As the forming method, whichever can be used among the plasma CVD method, the low pressure method and the sputtering method. Whichever can be used among the amorphous silicon film, microcrystalline silicon film and the crystalline silicon film. After that, the heat activation step is carried out and the residual metallic element in the island-shape semiconductor layers 404 and 410 to 412 are gettered through the source contact and the drain contact. The heat activation step is performed at 400 to 800° C. (preferably at 500 to 600° C.) The step of the heat activation can be performed for activating the impurity elements which bestow the n-conductivity type and the p-conductivity type. Hydrogenation steps can be added for terminating the dangling bonds in the island-shape semiconductor layers 404 and 410 to 412. (See FIG. 13B)

After that, the third conductive layer which functions as a part of source and drain wirings is formed. The third conductive layer can be used to restrict the occurrence of hillocks ans oxidation. The third conductive layer is patterned to function as a part of source wirings 452 to 455 and drain wirings 456 to 459. After that, the gettering layer 451 is etched in a self alignment manner using the third conductive layer as a mask. And the gettering layer 451 is made function as a part of source wirings 452 to 455 and drain wirings 456 to 459 with the third conductive layer.

Next, a silicon nitride film, a silicon oxide film, or a silicon oxynitride film is formed with a thickness of between 50 and 500 nm (typically from 100 to 300 nm) as a passivation film 460. Whichever film is used, it is formed so as to become a dense film, providing isolation from external moisture, and further, has the added function of acting as a cap layer in a second hydrogenation step, performed later. For example, the passivation film 460 is formed of a dense silicon nitride film with a thickness of 200 nm, and if hydrogenation processing is performed in this state, then a desirable result can be obtained with respect to improving the TFT characteristics. This may be performed for between 1 and 12 hours at 300 to 500° C. in an atmosphere of 3 to 100% hydrogen, or in a nitrogen atmosphere. Of course, in addition to this method, a similar result can also be obtained by performing the hydrogenation process before the above silicon nitride film is deposited, or by using plasma hydrogenation. Additionally, plasma hydrogenation may be used together with the above hydrogenation method. Note that openings may be formed in the passivation film 460 in locations at which contact holes, for connecting a pixel electrode and a drain wiring, will later be formed. (See FIG. 13C)

A second interlayer insulating film 461 is formed next from an organic resin with a thickness of 1.0 to 1.5 µm. Materials such as polyimide, acrylic, polyamide, polyimide amide, and BCB (benzocyclobutane) can be used as the organic resin. A thermal polymerization type polyimide is used here, and this is baked at 300° C. after application to the substrate. A contact hole for reaching the drain wiring 459 is then formed in the second interlayer insulating film 461, and pixel electrodes 462 and 463 are formed. A transparent conducting film is used for the pixel electrodes in a transmitting type liquid crystal display device, and a metallic film is used in a reflecting type liquid crystal display device. A transmitting type liquid crystal display device is used in embodiment 3, and therefore a 100 nm thick indium tin oxide (ITO) film is formed by sputtering. (See FIG. 14)

Accordingly, the substrate having the TFTs of the driver circuit provided in the periphery of the pixel portion and the pixel TFT of the pixel portion on the same substrate is thus completed.

Figure 14:
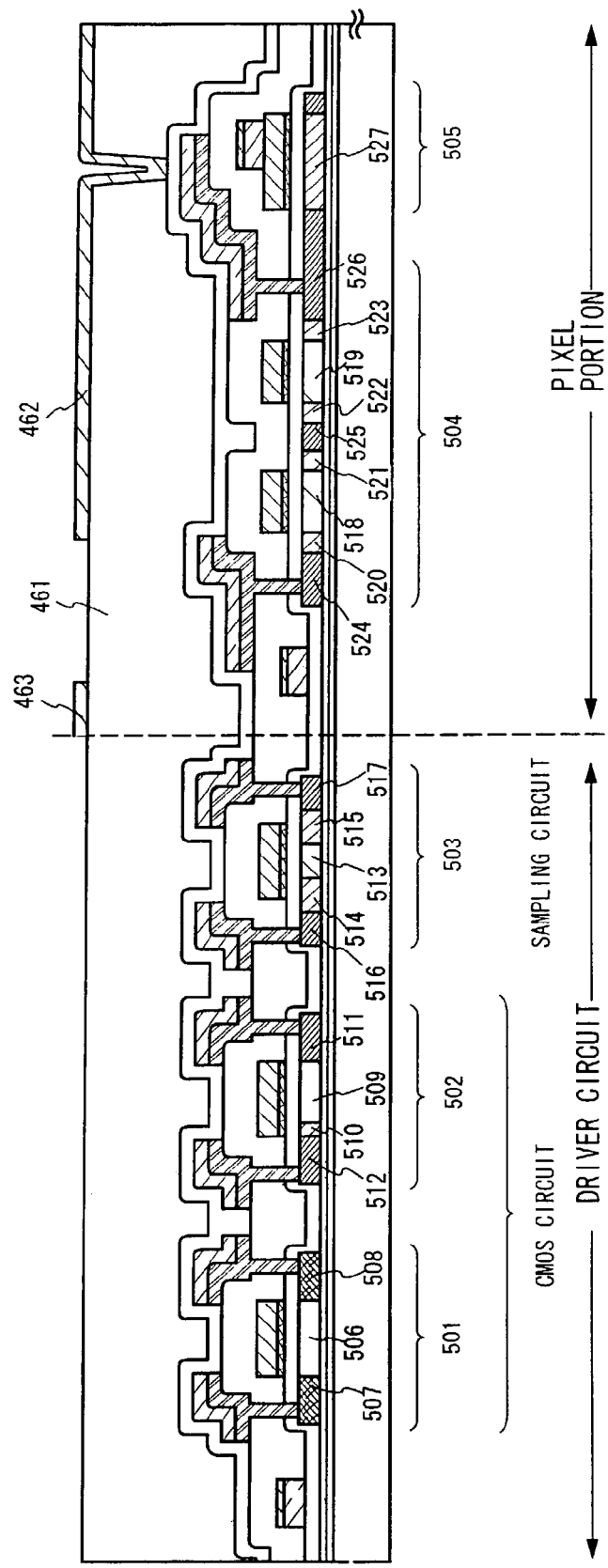
FIG. 14 illustrates the process of forming a pixel TFT and a driver circuit TFT on one substrate.

The p-channel TFT 501 of the driver circuit of the CMOS circuit has a channel forming region 506, source regions 507, and drain regions 508 in the island-shape semiconductor layer 404. The first n-channel TFT 502 has a channel forming region 509, an LDD region ($L_{ov}$) 510 overlapping the gate electrode 429, a source region 511, and a drain region 512 in the island-shape semiconductor layer 410. The length of the $L_{ov}$ region in the channel length direction is from 0.5 to 3.0 µm, preferable between 1.0 and 1.5 µm. A channel forming region 513, an $L_{ov}$ region, an $L_{off}$ region (an LDD region which does not overlap the gate electrode, hereafter referred to as an $L_{off}$ region) 514, 515 and source or drain regions 516, 517 are formed in the island-shape semiconductor layer 411 of the n-channel TFT 503 of the sampling circuit, and the length of the $L_{off}$ region in the channel length direction is from 0.3 to 2.0 µm, preferably between 1.0 and 1.5 µm. The island-shape semiconductor layer 412 of the pixel TFT 504 has channel forming regions 518 and 519, $L_{off}$ regions 520 to 523, and source or drain regions 524 to 526. The length of the $L_{off}$ region in the channel length direction is from 0.5 to 3.0 µm, preferably between 1.5 and 2.5 µm. In addition, the storage capacitor 505 is formed from the capacitor wirings 432 and 449, an insulating film made from the same material as the gate insulating film, and a semiconductor layer 527 connected to the drain region 526 of the pixel TFT 504 and in which has an added impurity element that imparts n-type conductivity. In FIG. 14 a double gate structure is used for the pixel TFT 504, but a single gate structure may be used, and a multi-gate structure in which a plural number of gates are formed may also be used without hindrance.

[Embodiment 4]

Another method of doping the metallic element promoting crystallization of the amorphous silicon film used in Embodiments 1 to 3 is described with reference to FIG. 15.

Figure 15A:
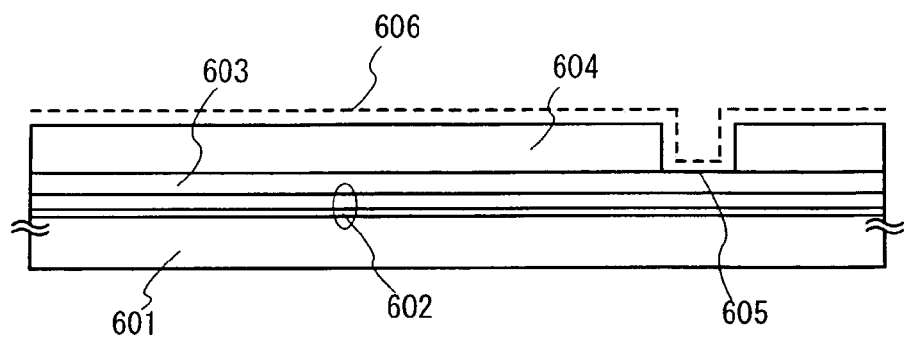
FIG. 15 illustrates a method of doping a metallic element for promoting crystallization.
Figure 15B:
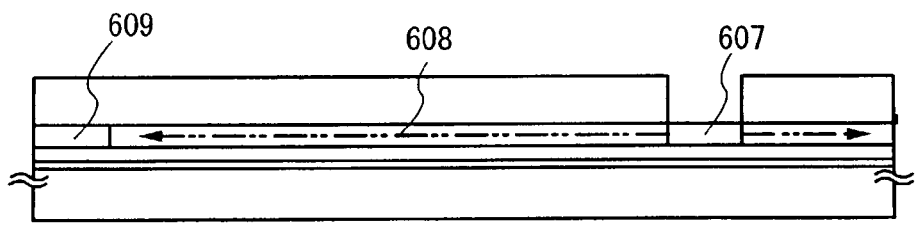

First, as illustrated in FIG. 15A, similarly to the cases of Embodiments 1 to 3, a base insulating film 602 and an amorphous silicon film 603 are formed on a substrate 601. Then, a mask insulating film 604 of silicon oxide is formed, and an opening 605 for selectively doping a metallic element is formed.

In this state, ultraviolet light is irradiated in an oxygen atmosphere to form a thin oxide film on the amorphous silicon film 603. Then, nickel acetic acid solution with 100 ppm of Ni contained therein is applied by spin coating to form a very thin layer 606 containing Ni on the surface of the amorphous silicon film 603 exposed at the opening 605 (See FIG. 15A).

Then, thermal annealing is performed in a nitrogen atmosphere at 600° C. for eight hours to crystallize the amorphous silicon film 603. Crystallization begins from the opening 605 in the mask insulating film 604 where Ni is selectively doped, and proceeds in parallel with the film surface (in a lateral direction) from this Ni doped region. The region crystallized in this way is herein referred to as a lateral growth region. In the amorphous silicon film 603, there are an Ni doped region 607, a lateral growth region (crystalline silicon film) 608, and a region where the lateral growth does not reach (amorphous silicon film) 609. When an active layer of a TFT is formed, the lateral growth region 608 is patterned and an island-like portion is left to be such an active layer.

In this way, a crystalline silicon film is obtained. After that, a TFT is formed in a similar way as in Embodiments 1 to 3.

[Embodiment 5]

A substrate formed in Embodiment 3 is referred to as an active matrix substrate. In the present embodiment, a process of manufacturing an active matrix liquid crystal display device from the active matrix substrate and an example of a circuit arrangement are described with reference to FIGS. 16 and 17. A method of manufacturing the active matrix substrate is described in Embodiment 3, and thus, the description thereof is omitted here.

Figure 16:
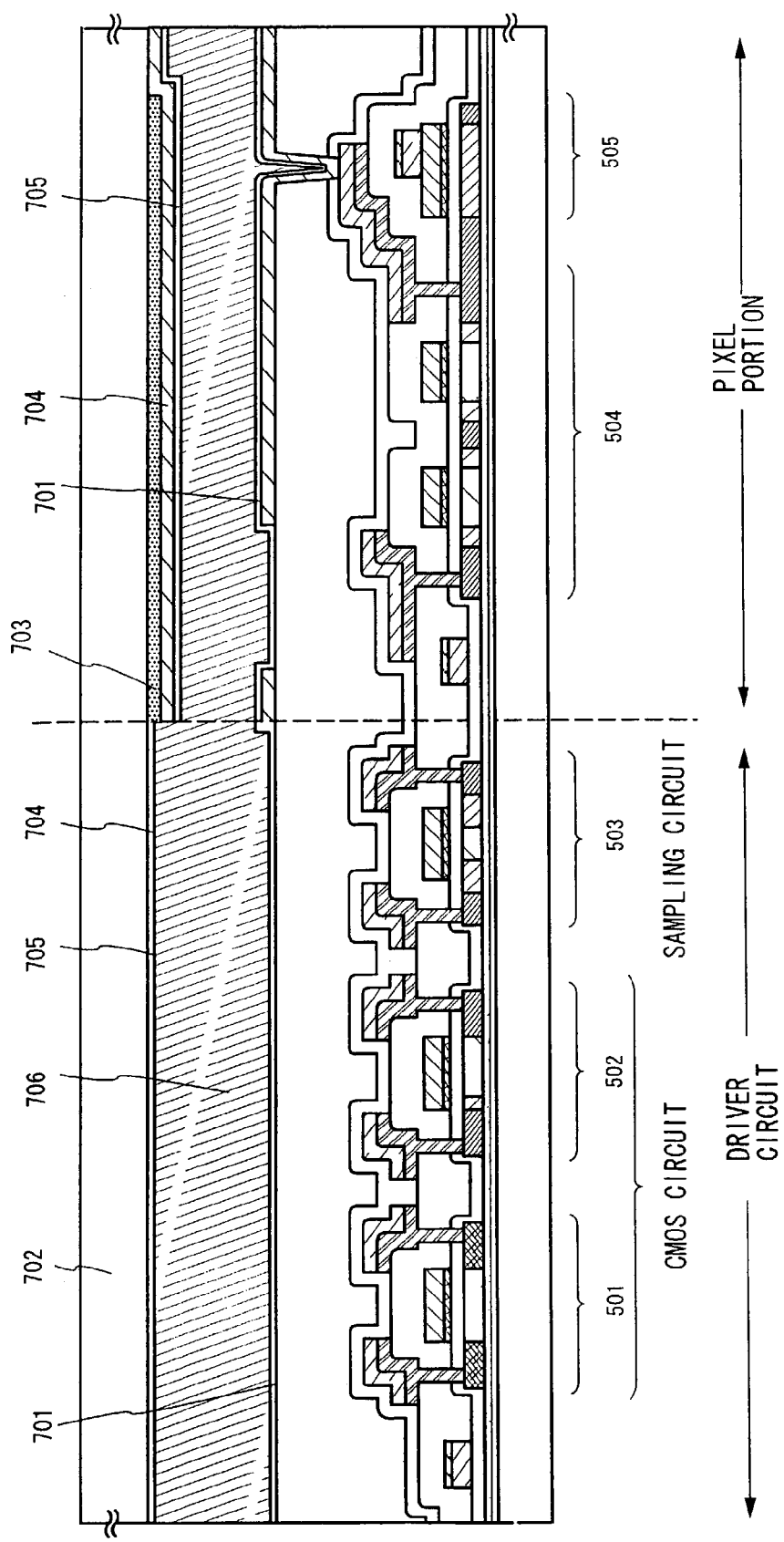
FIG. 16 illustrates a structure of an active matrix liquid crystal display device.

As illustrated in FIG. 16, an oriented film 701 is formed with respect to an active matrix substrate in the state illustrated in FIG. 14. A polyimide resin is often used as an oriented film for a liquid crystal display element. A light shielding film 703, a transparent conductive film 704, and an oriented film 705 are formed on an opposing substrate 702 on an opposing side. The oriented films are, after being formed, rubbed such that liquid crystal molecules are oriented at a predetermined pretilt angle. Then, the active matrix substrate having a pixel portion and a CMOS circuit formed thereon and the opposing substrate are adhered to each other through a sealing material, spacers (both not shown), and the like in a conventional cell fabricating process. After that, a liquid crystal material 706 is injected between the substrates, and complete sealing is performed using a sealant (not shown). The liquid crystal material may be a conventional one. In this way, the active matrix liquid crystal display device illustrated in FIG. 16 is completed.

Figure 17:
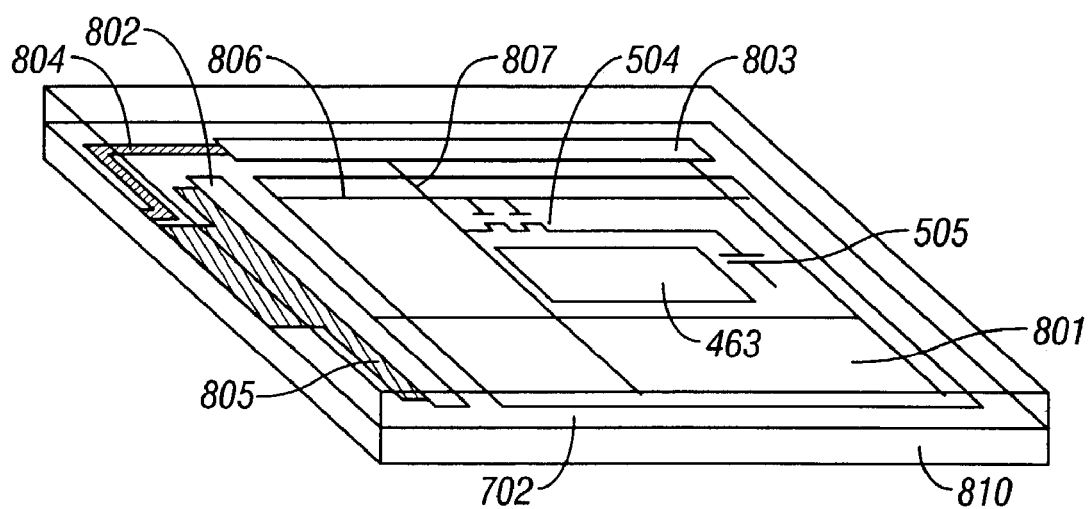
FIG. 17 illustrates a circuit arrangement of an active matrix liquid crystal display device.

FIG. 17 illustrates a schematic circuit arrangement of the active matrix substrate illustrated in FIG. 16. In a pixel portion 801, gate wirings 806 and source wirings 807 intersect each other so as to be matrix-like. A scanning signal driver circuit 802 and an image signal driver circuit 803 are on the periphery of the pixel portion 801.

The circuit arrangement illustrated here is just an example, and the present embodiment is not limited thereto. The circuit arrangement may be appropriately set by those who implement the present invention.

[Embodiment 6]

An active matrix substrate and a liquid crystal display device manufactured by implementing the present invention can be used in various electro-optical devices and also in organic EL liquid crystal display devices. The present invention can then be applied to all electronic equipment that incorporates this kind of electro-optical device as a display medium. The following can be given as this type of electronic equipment: a personal computer; a digital camera; a video camera; a portable information terminal (such as a mobile computer, a portable telephone, and an electronic book); and a navigation system. These examples are shown in FIGS. 18A to 20C.

Figure 18A:
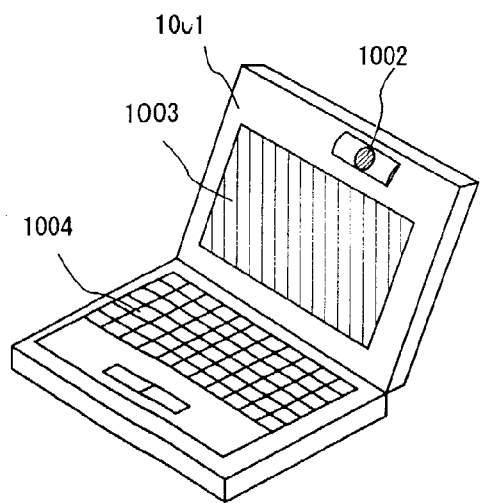
FIG. 18 illustrates examples of a semiconductor device.

FIG. 18A shows a personal computer comprising a main body 1001 provided with a microprocessor, a memory and the like, an image inputting unit 1002, a display device 1003, and a key board 1004. The liquid crystal display device and the organic EL display device of the present invention may form the display device 1003.

Figure 18B:
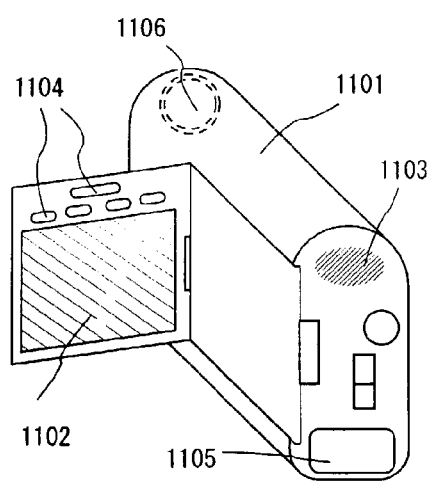

FIG. 18B shows a video camera, which is composed of a main body 1101, a display device 1102, an audio input unit 1103, operation switches 1104, a battery 1105, and an image receiving unit 1106. The liquid crystal display device and the organic EL display device of the present invention can be applied to the display device 1102.

Figure 18C:
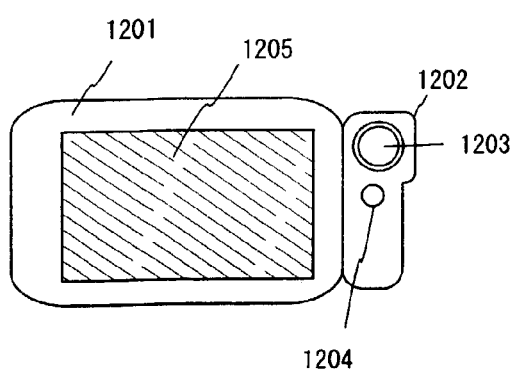

FIG. 18C shows a portable information terminal, which is composed of a main body 1201, an image inputting unit 2102, an image receiving unit 1203, operation switches 1204 and a display device 1205. The liquid crystal display device and the organic EL display device of the present invention may form the display device 1205.

Figure 18D:
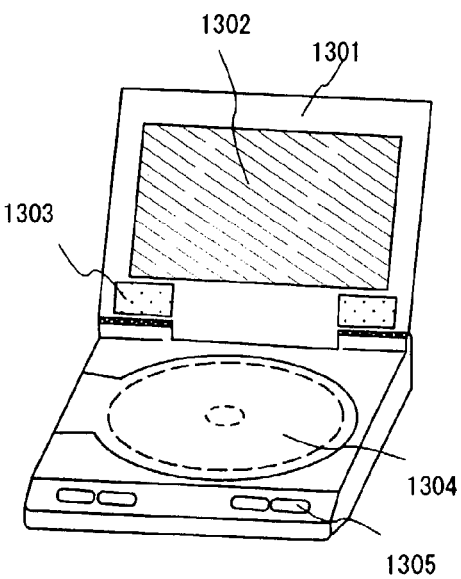

FIG. 18D shows a player which uses a recording medium with a program recorded therein (hereafter referred to as a recording medium), and which is composed of a main body 1301, a display device 1302, speaker units 1303, a recording medium 1304, and operation switches 1305. Note that a DVD (Digital Versatile Disk), or Compact Disk (CD) is used as the recording medium for this device, and that the device is capable of reproduction of a music program, display of an image, and information display through video games (or television games) and through the Internet. The liquid crystal display device and the organic EL display device of the present invention can be suitably used for the display device 1302.

Figure 19A:
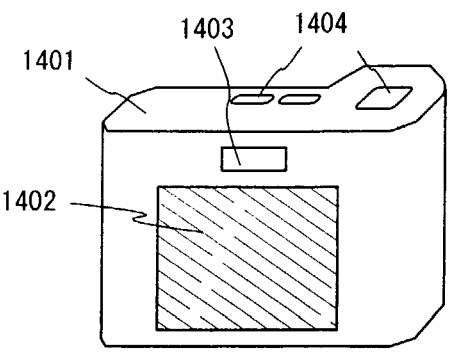
FIG. 19 illustrates examples of a semiconductor device.

FIG. 19A shows a digital camera, which is composed of a main body 1401, a display device 1402, an eye piece portion 1403, operation switches 1404, and an image receiving unit (not shown in the figure). The liquid crystal display device and the organic EL display device of the present invention can be applied to the display device 1402.

Figure 19B:
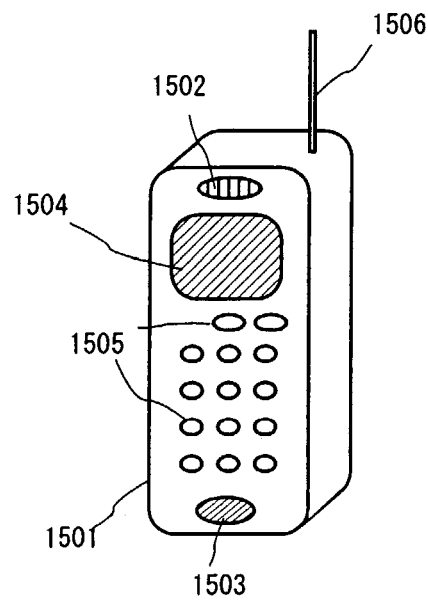

FIG. 19B shows a portable phone, which is composed of a main body 1501, a sound outputting unit 1502, a sound inputting unit 1503, a display device 1504, operation switched 1505, an antenna 1506 and so forth. The present invention can be applied to the a sound outputting unit 1502, a sound inputting unit 1503, the display device 1504 and other signal controlling circuit.

Figure 19C:
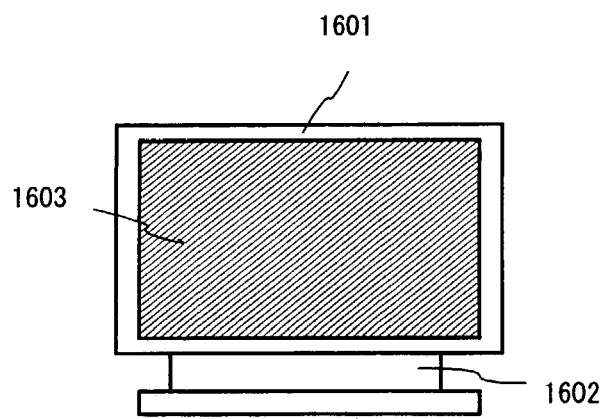

FIG. 19C shows a display that is comprised of a main body 1601, a support stand 1602 and display portion 1603 and so forth. The present invention can be applied to the display portion 1603. They are especially advantageous for cases in which the screen is made large, and is favorable for displays having a diagonal greater than or equal to 10 inches (especially one which is greater than or equal to 30 inches).

Figure 20A:
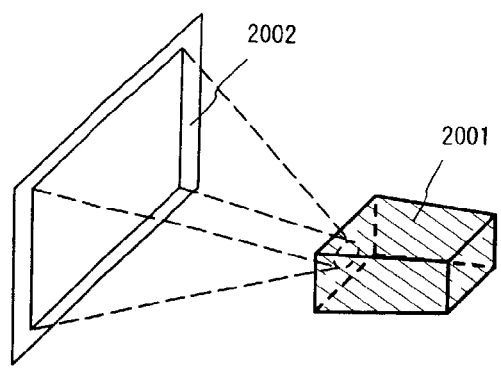
FIG. 20 illustrates examples of a projector.
Figure 20B:
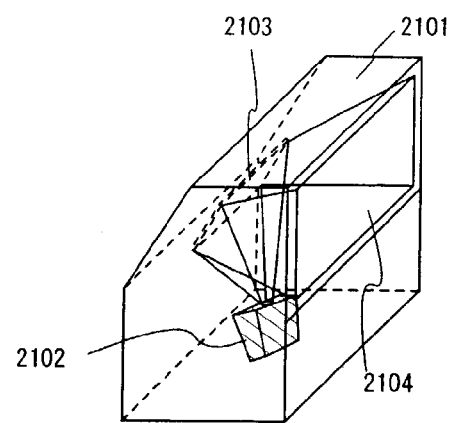

FIG. 20A shows a front type projector, which is composed of an optical light source system and display device 2001, and a screen 2002. The present invention can be applied to the display device, and to other signal control circuits. FIG. 20B shows a rear type projector, which is composed of a main body 2101, an optical light source system and display device 2102, a mirror 2103, and a screen 2104. The present invention can be applied to the display device, and to other signal control circuits.

Figure 20C:
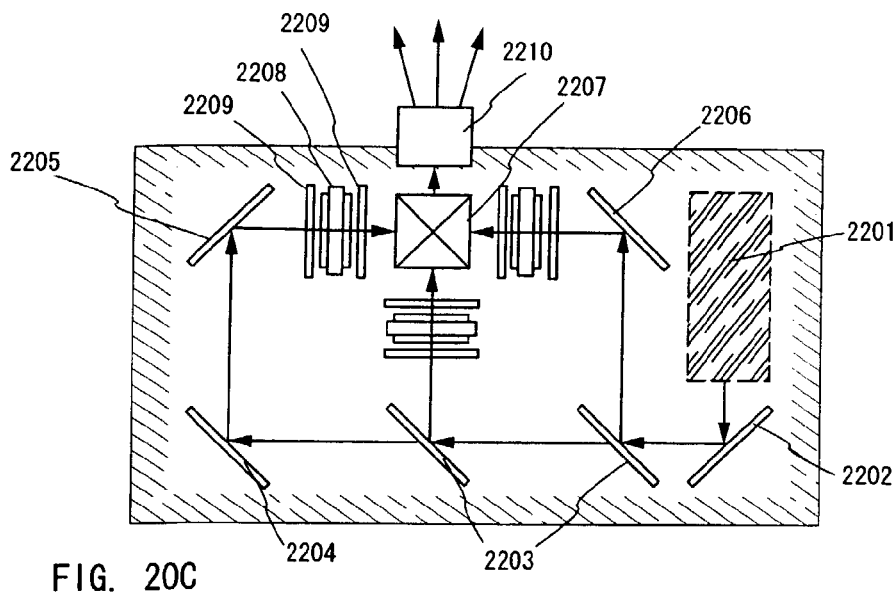
Figure 20D:
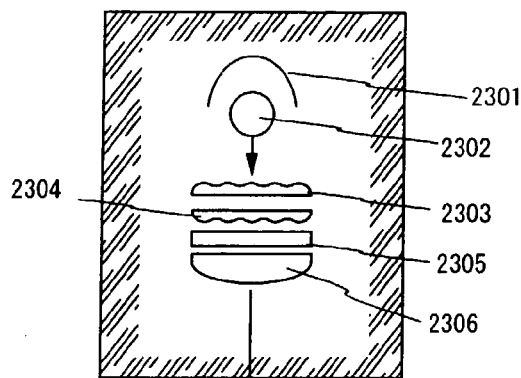

FIG. 20C is a drawing showing an example of the structure of the optical light source system and the display devices 2001 and 2102 in FIGS. 20A and 20B. The optical light source system and display devices 2001 and 2102 each consist of an optical light source system 2201, mirrors 2202 and 2204 to 2206, dichroic mirrors 2203, a beam splitter 2207, liquid crystal display devices 2208, phase difference plates 2209, and an optical projection system 2210. The optical projection system 2210 is composed of a plural number of optical lenses. In FIG. 20C an example of a three plate system is shown in which three liquid crystal display devices 2208 are used, but there are no special limitations and an optical system of single plate system is acceptable, for example. Further, the operator may suitably set optical lenses, polarizing film, film to regulate the phase, IR films, etc., within the optical path shown by the arrows in FIG. 20C. In addition, FIG. 20D shows an example of the structure of the optical light source system 2201 of FIG. 20C. In this embodiment, the optical light source system 2201 is composed of a reflector 2301, a light source 2302, lens arrays 2303 and 2304, a polarization conversion element 2305, and a condenser lens 2306. Note that the optical light source system shown in FIG. 20D is an example, and it is not limited to the structure shown in the figure.

Further, although not shown in the figures, it is also possible to apply the present invention to, for example, a read-in circuit of a navigation system or an image sensor. Thus the application range for the present invention is extremely wide, and it can be applied to electronic equipment in all fields. Further, the electronic equipment of this embodiment can be realized with a structure which is freely combined Embodiments 1 to 6 using crystalline techniques disclosed in Embodiment modes 1 to 3.

According to the present invention, by forming a silicon film containing phosphorus in a source contact and a drain contact and using it as a gettering site, a metallic element promoting crystallization of an amorphous silicon film can be effectively removed or decreased to improve the stability and the reliability of the electric characteristics of the TFT, and further, since processes of forming and patterning a mask layer such as an oxide film which is conventionally necessary in gettering can be eliminated, the productivity can be improved. Further, while gettering using doping is accompanied by damage of the crystal structure in a device region and the source and drain resistances are lowered in a p-channel TFT, and thus, a further doping process is necessary, according to a method of the present invention, satisfactory gettering can be performed without such damage.

What is claimed is:

1. A method of manufacturing a semiconductor device comprising the steps of:
    forming a base insulating film on a substrate;
    forming an amorphous semiconductor film on the base insulating film;
    introducing a metallic element to the amorphous semiconductor film;
    crystallizing the amorphous semiconductor film to form a crystalline semiconductor film;
    forming a gate insulating film on the crystalline semiconductor film;
    forming a gate electrode on the gate insulating film;
    introducing an impurity element in selected regions of the crystalline semiconductor film to form a source region and a drain region;
    forming an interlayer insulating film on the gate electrode;
    forming at least one contact hole in the interlayer insulating film, the contact hole reaching one of the source region and the drain region;
    forming a first conductive film on the interlayer insulating film and in the contact hole so as to reach the one of the source region and the drain region, the first conductive film containing an impurity element belonging to the group 15 of the periodic table; and then
    gettering by thermal annealing the metallic element contained in the crystalline semiconductor film; and
    forming a second conductive film on the first conductive film.

2. A method according to claim 1, wherein said semiconductor film comprises silicon.

3. A method according to claim 1, wherein the first conductive film comprises silicon.

4. A method according to claim 1, wherein by the thermal annealing, the metallic element is gettered from the crystallized semiconductor film into the first conductive film.

5. A method according to claims 1, wherein the thermal annealing also activates the impurity element introduced in the crystallized semiconductor film.

6. A method according to claim 1, wherein the metallic element is one or more elements selected from the group consisting of Fe, Co, Ni, Ru, Rh, Pd, Os, Ir, Pt, Cu, Au, Ge, Pb, and In.

7. A method according to claim 1, wherein the impurity element contained in the first conductive film is phosphorus.

8. A method according to claim 1, wherein the concentration of the impurity element in the first conductive film is $1\times10^{19}$ atoms/cm$^3$ or more.

9. A method according to claim 1, wherein the first conductive film is patterned using the conductive film in a self-aligning manner to function as wiring.

10. A method of manufacturing a semiconductor device comprising the steps of:
    forming a gate electrode on the insulating surface;
    forming a gate insulating film on the gate electrode;
    forming an amorphous semiconductor film on the gate insulating film;
    introducing a metallic element to the amorphous semiconductor film;
    crystallizing the amorphous semiconductor film to form a crystalline semiconductor film;
    forming a protective insulating film on the crystalline semiconductor film;
    introducing an impurity element in selected regions of the crystalline semiconductor film to form a source region and a drain region;
    forming an interlayer insulating film on the protective insulating film;
    forming at least one contact hole in the protective insulating film and the interlayer insulating film, the contact hole reaching one of the source region and the drain region;
    forming a first conductive film on the interlayer insulating film and in the contact hole reaching the one of the source region and the drain region, the first conductive film containing an impurity element belonging to group 15 of the periodic table;
    gettering the metallic element contained in the crystalline semiconductor film in to the first conductive film by thermal annealing; and
    forming a second conductive film on the first conductive film.

11. A method according to claim 10, wherein said semiconductor film comprises silicon.

12. A method according to claim 10, wherein the first conductive film comprises silicon.

13. A method according to claim 10 wherein by the thermal annealing, the metallic element is gettered from the crystallized semiconductor film into the first conductive film.

14. A method according to claims 10, wherein the thermal annealing also activates the impurity element introduced in the crystallized semiconductor film.

15. A method according to claim 10, wherein the metallic element is one or more elements selected from the group consisting of Fe, Co, Ni, Ru, Rh, Pd, Os, Ir, Pt, Cu, Au, Ge, Pb, and In.

16. A method according to claim 10, wherein the impurity element contained in the first conductive film is phosphorus.

17. A method according to claim 10, wherein the concentration of the impurity element in the first film is $1\times10^{19}$ atoms/cm$^3$ or more.

18. A method according to claim 10, wherein the first conductive film and the second conductive film are patterned to function as wiring.

19. A method manufacturing a semiconductor device comprising the steps of:
    forming a semiconductor film comprising amorphous silicon on an insulating surface;
    providing said semiconductor film with a metal containing material having a capability of promoting crystallization of amorphous silicon;
    crystallizing said semiconductor film provided with said metal containing material;
    forming source and drain regions in the crystallized semiconductor film;
    forming an insulating film over the crystallized semiconductor film;
    forming at least one contact hole in the insulating film to expose at least one of the source and drain regions;
    forming a conductive film over the semiconductor film and the insulating film, wherein said conductive film is in contact with at least one of the source and drain regions in the semiconductor film through said at least one contact hole and said conductive film contains an impurity element belonging to group 15 of the periodic table;
    gettering the metal contained in the crystallized semiconductor film into the conductive film; and patterning the conductive film after the gettering to form at least one of source and drain electrodes.

20. A method according to claim 19 wherein said conductive film comprises phosphorous doped silicon.

21. A method according to claim 19, wherein said metal is at least one of Fe, Co, Ni, Ru, Rh, Pd, Os, Ir, Pt, Cu, Au, Ge, Pb, and In.

22. A method according to claim 19, wherein said conductive film contains said impurity element belonging to the group of the periodic table at a concentration of $1 \times 10^{19}$ atoms/cm$^3$ or more.

23. A method of manufacturing a semiconductor device comprising the steps of:
forming a semiconductor film comprising amorphous silicon on an insulating surface;
providing said semiconductor film with a metal containing material having a capability of promoting crystallization of amorphous silicon;
crystallizing said semiconductor film provided with said metal containing material;
forming source and drain regions in the crystallized semiconductor film;
forming an insulating film over the crystallized semiconductor film;
forming at least one contact hole in the insulating film to expose at least one of the source and drain regions;
forming a first conductive film on the insulating film wherein said first conductive film is in contact with at least one of the source and drain regions through said at least one contact hole and contains an impurity element belonging to the group 15 of the periodic table;
forming a second conductive film on the first conductive film;
gettering the metal contained in the crystallized semiconductor film into the first conductive film; and
patterning the first and second conductive films after the gettering to form at least one of source and drain electrodes.

24. A method according to claim 23 wherein said first conductive film comprises phosphorus doped silicon.

25. A method according to claim 23, wherein said metal is at least one of Fe, Co, Ni, Ru, Rh, Pd, Os, Ir, Pt, Cu, Au, Ge, Pb, and In.

26. A method according to claim 23, wherein said first conductive film contains the impurity element belonging to the group of the periodic table at a concentration of $1 \times 10^{19}$ atoms/cm$^3$ or more.

27. A method according to claim 1, wherein said second conductive film comprises a metal element selected from the group consisting of Al, Ti, W, Ta, and Cu.

28. A method according to claim 10, wherein said second conductive film comprises a metal element selected from the group consisting of Al, Ti, W, Ta, and Cu.

29. A method according to claim 23, wherein said second conductive film comprises a metal element selected from the group consisting of Al, Ti, W, Ta, and Cu.

30. A method of manufacturing a semiconductor device comprising the steps of:
forming a crystalline semiconductor film having at least channel, source, and drain regions over a substrate, said semiconductor film containing a metal element;
forming an interlayer insulating film over the semiconductor film;
forming at least one contact hole in the interlayer insulating film, the contact hole to expose one of the source region and the drain region;
forming a conductive film on the interlayer insulating film so as to reach at least one of the source region and the drain region in the semiconductor film through the contact hole, wherein the conductive film contains an impurity element belonging to group 15 of the periodic table; and
gettering the metal element contained in the crystalline semiconductor film into the conductive film in contact with the one of the source and drain regions by thermal annealing.

31. A method according to claim 30 further comprising a step of forming a gate electrode over the crystalline semiconductor film before forming the interlayer insulating film.

32. A method according to claim 30 further comprising a step of forming a gate electrode over the substrate before forming the semiconductor film.

33. A method according to claim 30 further comprising a step of patterning the conductive film for forming a part of one of a source electrode and a drain electrode after said gettering.

34. A method according to claim 30, wherein the conductive film comprises phosphorus doped silicon.

35. A method according to claim 30 further comprising a step of forming a second conductive film over the conductive film, the second conductive film comprising a metal element selected from the group consisting of Al, Ti, W, Ta, and Cu.

* * * * *